(12) United States Patent
Kondo et al.

(10) Patent No.: US 6,285,743 B1
(45) Date of Patent: Sep. 4, 2001

(54) METHOD AND APPARATUS FOR SOFT X-RAY GENERATION

(75) Inventors: Hiroyuki Kondo, Tsukuba; Noriaki Kandaka, Kawasaki, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/395,162

(22) Filed: Sep. 14, 1999

(30) Foreign Application Priority Data

Sep. 14, 1998 (JP) .................................................. 10-259060
Sep. 21, 1998 (JP) .................................................. 10-265888
Sep. 21, 1998 (JP) .................................................. 10-265889

(51) Int. Cl.⁷ ...................................................... G21K 5/00
(52) U.S. Cl. ........................................... 378/119; 378/143
(58) Field of Search ................................... 378/119, 143, 378/84, 145

(56) References Cited

U.S. PATENT DOCUMENTS

| | | | |
|---|---|---|---|
| 5,577,091 | * 11/1996 | Richardson et al. | 378/119 |
| 5,577,092 | 11/1996 | Kublak et al. | 378/119 |
| 6,172,825 | * 1/2001 | Takahashi | 359/859 |
| 6,195,201 | * 2/2001 | Koch et al. | 359/366 |

* cited by examiner

Primary Examiner—David P. Porta
(74) Attorney, Agent, or Firm—Morgan, Lewis & Bockius LLP

(57) ABSTRACT

A soft X-ray source includes a mirror having a focal point, the mirror being one of parabolic and ellipsoidal, a nozzle delivering a target material to a plasma generation point substantially coincident with the focal point, and a laser source delivering a pulsed laser beam to the plasma generation point, wherein a plasma is generated at the plasma generation point upon irradiation by the pulsed laser beam, the plasma emitting soft X-rays that are formed into beams by the mirror, the beams being parallel if the mirror is parabolic and converging if the mirror is ellipsoidal.

33 Claims, 19 Drawing Sheets

# METHOD AND APPARATUS FOR SOFT X-RAY GENERATION

This application claims the benefit of Japanese Application No. 10-259060, filed in Japan on Sep. 14, 1998, Japanese Application No. 10-265888, filed in Japan on Sep. 21, 1998, and Japanese Application No. 10-265889, filed in Japan on Sep. 21, 1998, all of which are hereby incorporated by reference.

BACKGROUND OF THE INVENTION

1. Field of the Invention

The present invention relates to soft X-ray generation, and more particularly, to a method and apparatus for generating soft X-rays for semiconductor manufacturing.

2. Discussion of the Related Art

In a conventional process, a pattern from a mask is reduced, projected and transferred onto a silicon wafer using visible or ultraviolet light during the manufacturing of semiconductor integrated circuits. The silicon wafer is coated with a photoresist compound that is sensitive to selected wavelengths of light. As technological advances necessitate the use of increasingly more complex and finer patterns, the diffraction limit of light sources is quickly being approached. Thus, the use of soft X-rays with wavelengths shorter than the wavelengths of ultraviolet light, i.e., wavelengths of about 13 nm or about 11 nm, is becoming necessary to achieve required pattern resolution.

A laser plasma X-ray source (LPX) may be used to produce soft X-rays with a wavelength of about 13 nm or about 11 nm. In the LPX, electrons are stripped from the atoms of a target material by an intense electric field when a pulsed light with an irradiation intensity exceeding about $10^{10}$ W/cm$^2$ is focused and directed onto the target material. The target material is converted into a plasma, and soft X-rays radiate from the plasma. The soft X-rays have an extremely high brightness. The LPX apparatus is very compact when compared to other light sources capable of producing soft X-rays (for example, a synchrotron facility). Thus, use of the LPX to generate soft X-rays for semiconductor wafer exposure is preferred. LPX's may also be used for X-ray microscopes, as well as other applications.

The generation of debris is a serious problem in the LPX. When a solid target material, such as metal, is irradiated with laser light, ions and atoms which form the plasma are displaced by the rapid expansion of the plasma. Portions of the target material located in the vicinity of the plasma are scattered into the surrounding space. Optical elements, e.g., multi-layer film mirrors, thin-film filters, etc., are frequently installed in the vicinity of the plasma in order to shape the beams of generated soft X-rays. Thus, debris are deposited on the surfaces of the optical elements. This results in a deterioration of their optical performance (for example, reflectivity or transmissivity, etc.). Plasma is typically generated over a long period of time (often many months) at a high frequency (e.g., 1 kHz or greater) during soft X-ray exposure of semiconductor wafers. Accordingly, a large quantity of debris is generated over time. Thus, a reduction in the generation of debris is of great interest.

Kublak et al., in U.S. Pat. No. 5,577,092, show an LPX which uses a gaseous target material to solve the problem of debris generation. In their approach, a gas is directed through a nozzle at a supersonic velocity into a vacuum vessel. Clusters of gas molecules are formed through the resulting adiabatic expansion. Plasma is generated by irradiating these clusters of gas molecules with laser light. Since the target material is a gas, there is no deposition of the target material on the surfaces of the soft X-ray optical elements, even if the gas diffuses into the surrounding areas after plasma formation. Accordingly, there is no drop in the optical performance of these elements. Thus, it is reported that the useful life of the mirrors in such a soft X-ray optical system may reach $10^9$ shots.

Richardson et al, in U.S. Pat. No. 5,577,091, show an LPX which uses fine water droplets as a target material. In this method, the fine water droplets are directed into a vacuum vessel. Plasma is formed by irradiating the fine water droplets with laser light. The fine water droplets evaporate at the time of plasma formation. Fine water droplets that are not irradiated and are scattered by the plasma (and adhere to the optical elements) are easily removed. Thus, the degradation of performance as a result of debris generation and scattering is reduced.

However, the prior art soft X-ray sources have the following problems. First, the X-ray spatial intensity distribution is frequently non-uniform and asymmetrical, resulting in uneven exposure of a semiconductor wafer. This often results from the plasma region being nonspherical and asymmetrical. Second, structural components needed to support the nozzle and other elements within the vacuum vessel generate shadows, which further reduce the quality of the X-ray intensity distribution.

SUMMARY OF THE INVENTION

Accordingly, the present invention is directed to a method and apparatus for soft x-ray generation that substantially obviates the problems due to limitations and disadvantages of the related art.

An object of the present invention is to provide a method and apparatus for improved soft X-ray generation.

Another object of the present invention is to provide a method and apparatus for improved soft X-ray generation using a gas, a liquid or a solid target material.

Another object of the present invention is to provide a method and apparatus for improved soft X-ray generation using a solid or liquid target material to generate axially symmetrical parallel soft X-rays beams.

Another object of the present invention is to provide a method and apparatus for obtaining a pattern of uniform resolution from an projection system formed of multiple reflective elements.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in one aspect of the present invention there is provided a soft X-ray source including a mirror having a focal point, the mirror being parabolic or ellipsoidal, a nozzle delivering a target material to a plasma generation point substantially coincident with the focal point, and a laser source delivering a pulsed laser beam to the plasma generation point, wherein a plasma is generated at the plasma generation point upon irradiation by the pulsed laser beam, the plasma emitting soft X-rays that are formed into X-ray beams by the mirror, wherein the X-ray beams are parallel if reflected from the parabolic mirror and converging if reflected from the ellipsoidal mirror, and wherein one of an axis of the nozzle and an axis of the pulsed laser beam is coaxial with an axis of the mirror.

In another aspect of the present invention there is provided a method of generating soft X-rays comprising the steps of ejecting a target material from a nozzle towards a plasma generation piont, irradiating the target material with a pulsed laser beam; and forming soft X-ray beams by reflecting soft X-rays emitted by the plasma from a mirror, the mirror being parabolic or ellipsoidal, the soft X-ray beams being parallel or converging, wherein the pulsed laser beam is directed towards substantially a focal point of the mirror, the focal point being substantially coincident with the plasma generation point, and wherein one of an axis of the nozzle and an axis of the pulsed laser beam is coaxial with an axis of the mirror.

In another aspect of the present invention there is provided a soft X-ray exposure apparatus, a soft X-ray source emitting an axially symmetrical beam of soft X-rays; and an optical system comprising a plurality of reflective elements, the optical system including at least one nonreflective area corresponding to at least one shadow generated by the soft X-ray source.

In another aspect of the present invention there is provided a method of exposing a semiconductor wafer with soft X-rays including the steps of generating the soft X-rays with a soft X-ray source; and projecting the soft X-rays onto a projection optical system, the projections optical system including a plurality of reflective elements and at least one non-reflective area, wherein a shadow generated from the soft X-ray source is projected substantially onto the at least one non-reflective area, and wherein the soft X-rays projected onto the projection optical system are symmetrical with respect to an optical axis of the soft X-ray source.

In another aspect of the present invention there is provided an apparatus for generating soft X-rays including a nozzle ejecting a target material towards a plasma generation point;

a mirror having a focal point that substantially corresponds to the plasma generation point, the mirror being parabolic or ellipsoidal; and a laser source delivering at least two pulsed laser beams to the plasma generation point, wherein a plasma is generated at the plasma generation point in response to irradiation by the two pulsed laser beams, and wherein the plasma emits the soft X-rays, the soft X-rays being reflected into parallel or converging beams by the mirror, and wherein one of an axis of the nozzle and an axis of the pulsed laser beam is coaxial with an axis of the mirror.

In another aspect of the present invention there is provided a method of generating soft X-rays comprising the steps of ejecting a target material towards a plasma generation point from a nozzle; irradiating the target material at the plasma generation point with at least two pulsed laser beams so as to form a plasma; and reflecting soft X-rays emitted by the plasma from a mirror to form beams, the mirror being parabolic or ellipsoidal, wherein the beams are parallel if reflected from the parabolic mirror and converging if reflected from the ellipsoidal mirror, wherein a focal point of the mirror is substantially coincident with the plasma generation point, and wherein one of an axis of the nozzle and an axis of the pulsed laser beam is coaxial with an axis of the mirror.

In another aspect of the present invention there is provided an electromagnetic wave source including a low pressure vessel; a nozzle in the low pressure vessel, the nozzle ejecting a target material towards a plasma generation point; a mirror having a focus corresponding to the plasma generation point, the mirror being parabolic or ellipsoidal; and a laser irradiating the target material at the plasma generation point to convert a portion of the target material into a plasma, wherein electromagnetic energy emitted by the plasma is reflected from the mirror to form beams, wherein the beams are parallel if reflected from the parabolic mirror and converging if reflected from the ellipsoidal mirror.

In another aspect of the present invention there is provided an exposure apparatus including a source of electromagnetic waves in a wavelength range between 0.1 nm to 300 nm; a source of target material, the target material being one of a liquid, liquid droplets, fine particles, gas and clusters; an irradiation source for irradiating the target material and converting the target material into a plasma that emits radiation in the wavelength range between 0.1 nm to 300 nm, wherein the source of electromagnetic waves includes an optical element for shaping the radiation into the electromagnetic waves, wherein a reflective surface of the optical element is substantially axially symmetrical, wherein the irradiation source irradiates the target material from a direction of the optical element, wherein the source of the target material does not block a path of the electromagnetic waves, and wherein the electromagnetic waves are parallel if reflected from the parabolic mirror and converging if reflected from the ellipsoidal mirror.

In another aspect of the present invention there is provided an exposure apparatus including an electromagnetic wave source of a substantially axially symmetrical beam of electromagnetic waves with a wavelength between 0.1 nm and 300 nm; an illumination optical system including a plurality of reflective elements for reflecting the electromagnetic waves, the plurality of reflective elements being arc-shaped, aligned in a lateral direction and having their center axes aligned relative to each other; and a shadow extending substantially in the lateral direction of the illumination optical system, wherein the illumination optical system directs the electromagnetic waves onto an object being illuminated, and wherein the beam of electromagnetic waves is one of parallel and converging.

It is to be understood that both the foregoing general description and the following detailed description are exemplary and explanatory and are intended to provide further explanation of the invention as claimed.

BRIEF DESCRIPTION OF THE ATTACHED DRAWING

The accompanying drawings, which are included to provide a fuer understanding of the invention and are incorporated in and constitute a part of the specification, illustrate embodiments of the invention and together with the description serve to explain the principles of the invention.

Figure 12:
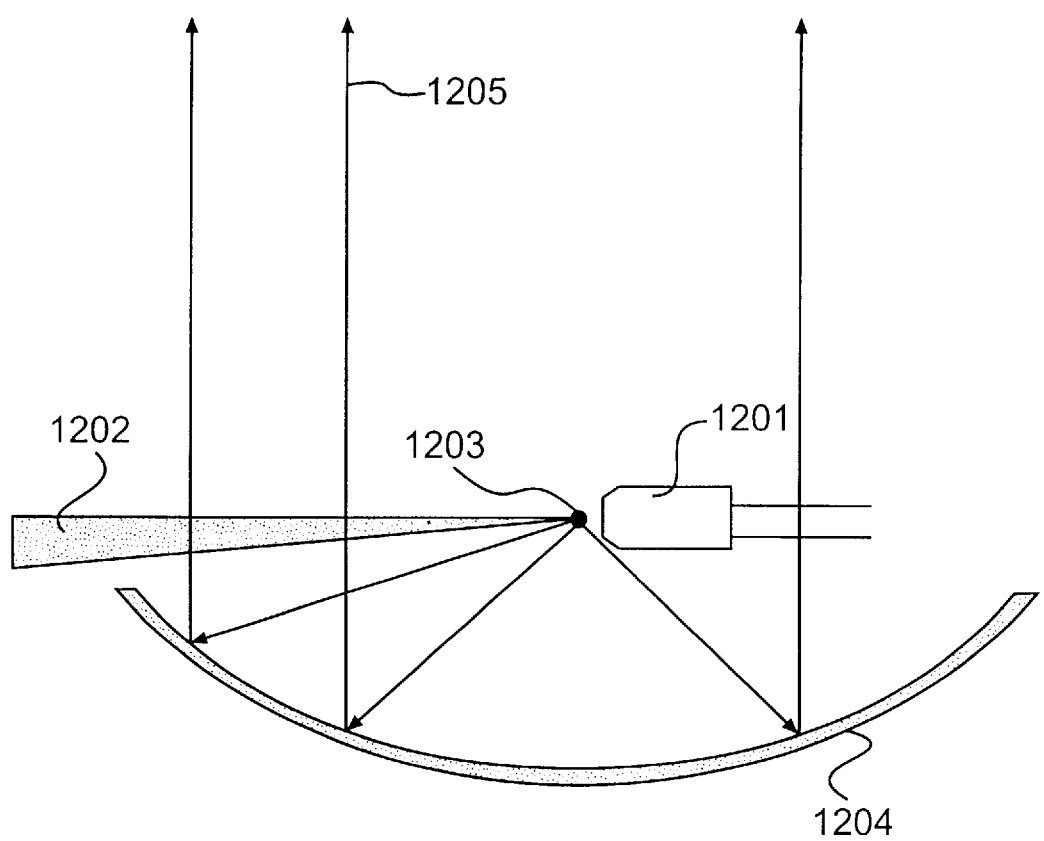
Figure 13:
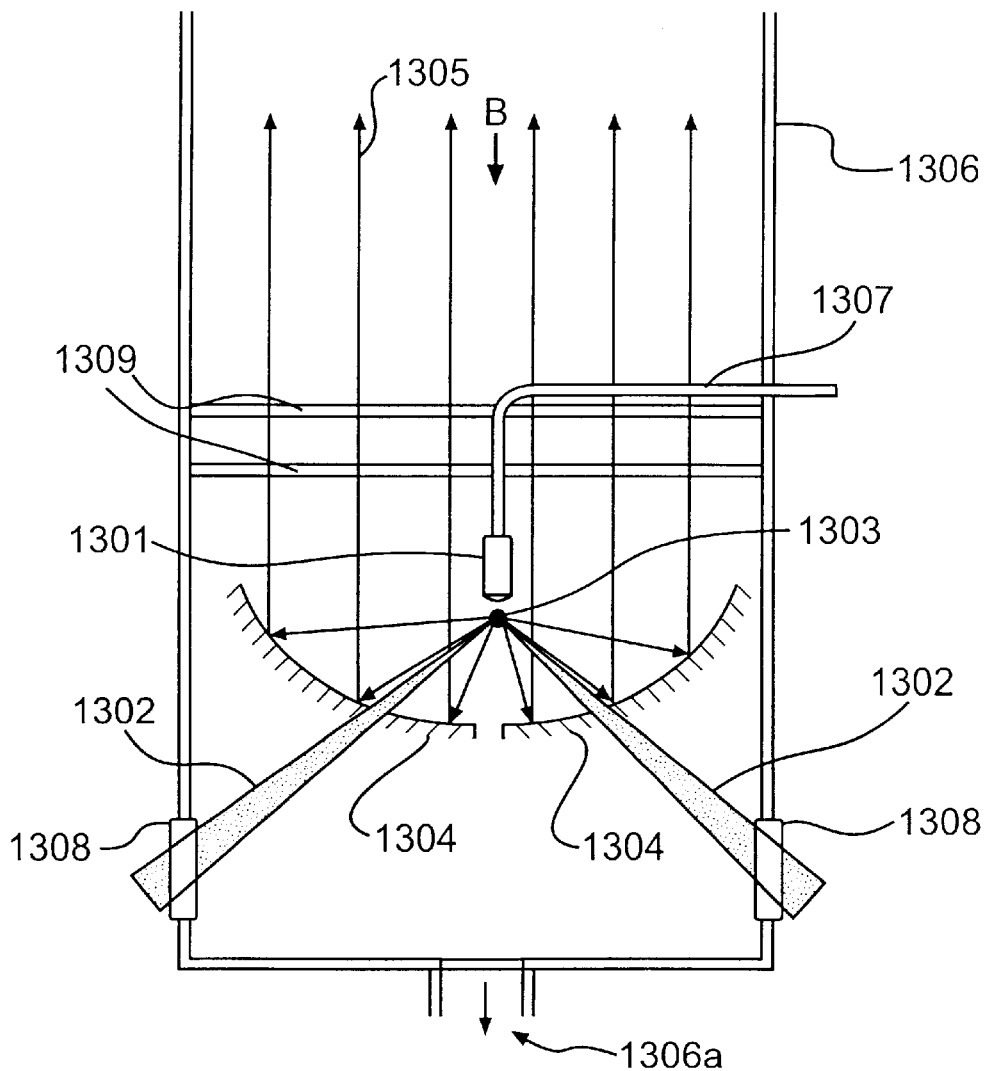
Figure 14:
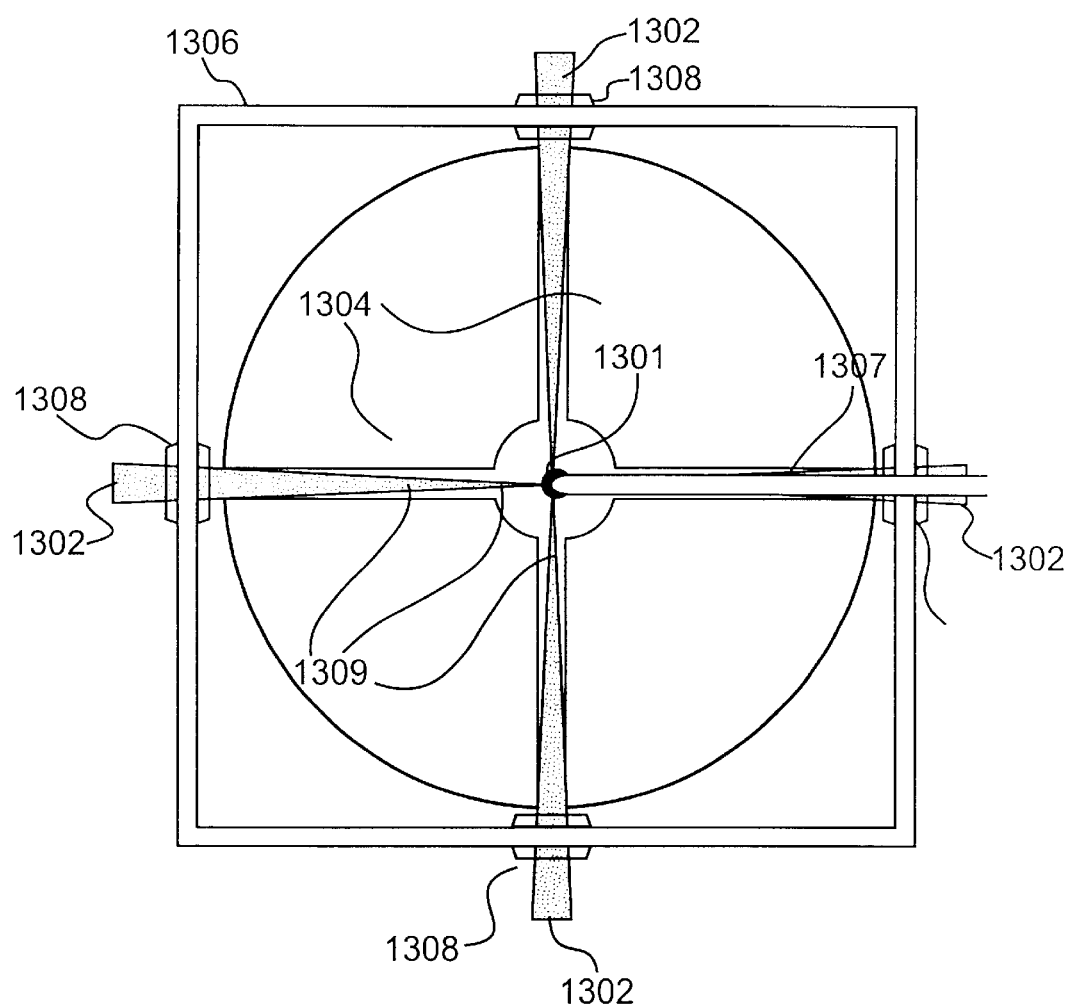
Figure 15:
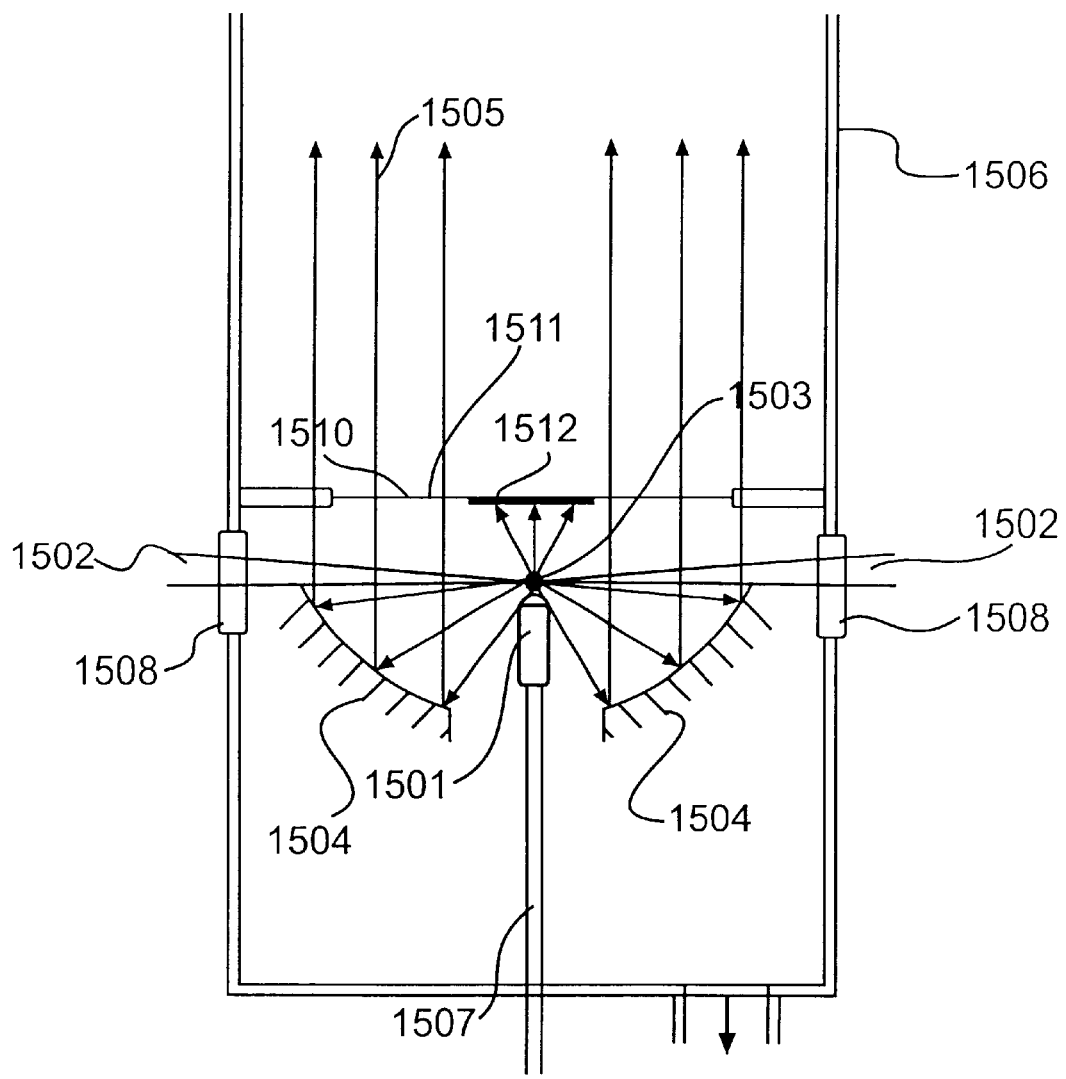
Figure 16:
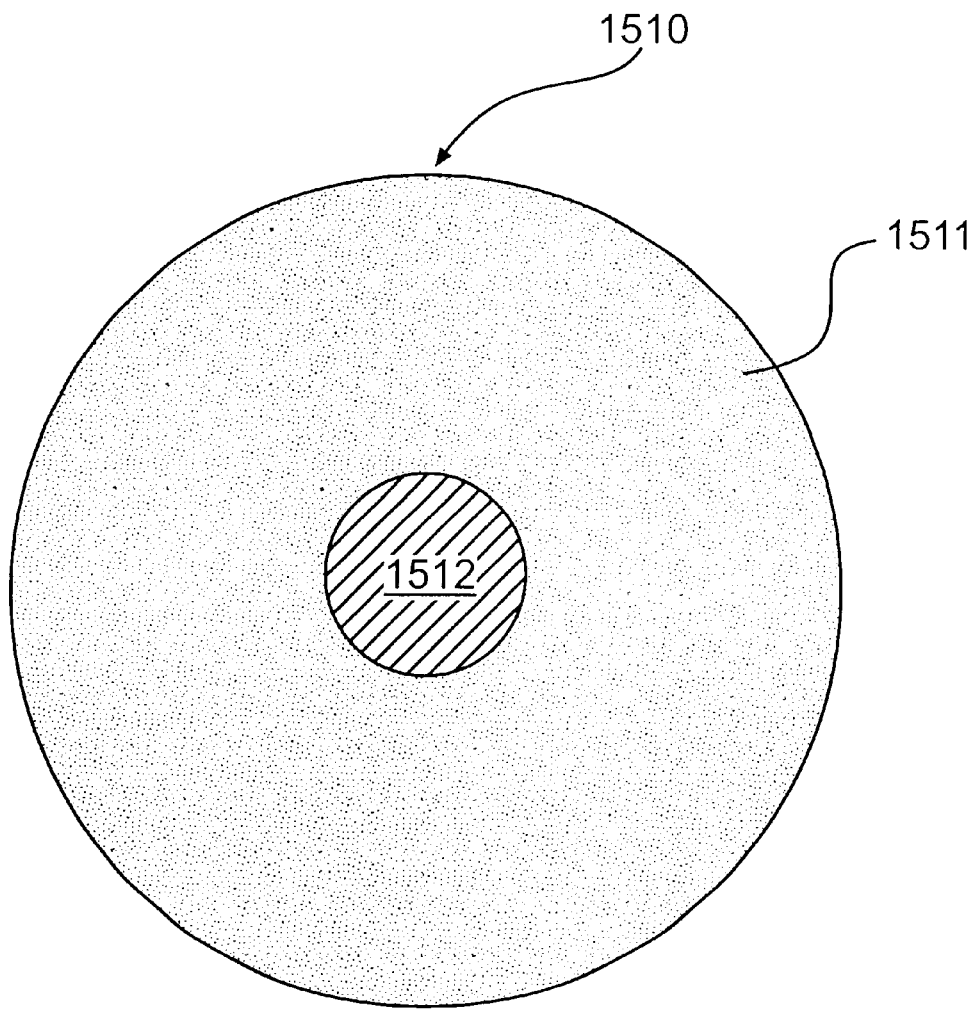

FIG. 12. shows undesirable positions for a gaseous target material nozzle and a pulsed laser light;

FIG. 13 shows a view of a device using a soft X-ray source using a gaseous target material of another embodiment of the present invention;

FIG. 14 shows a top view of the device of FIG. 13;

FIG. 15 shows another embodiment of the present invention of a soft X-ray generating apparatus that uses a gaseous target material;

FIG. 16 shows a bottom view of a soft X-ray filter shown in FIG. 15; and

Figure 17:
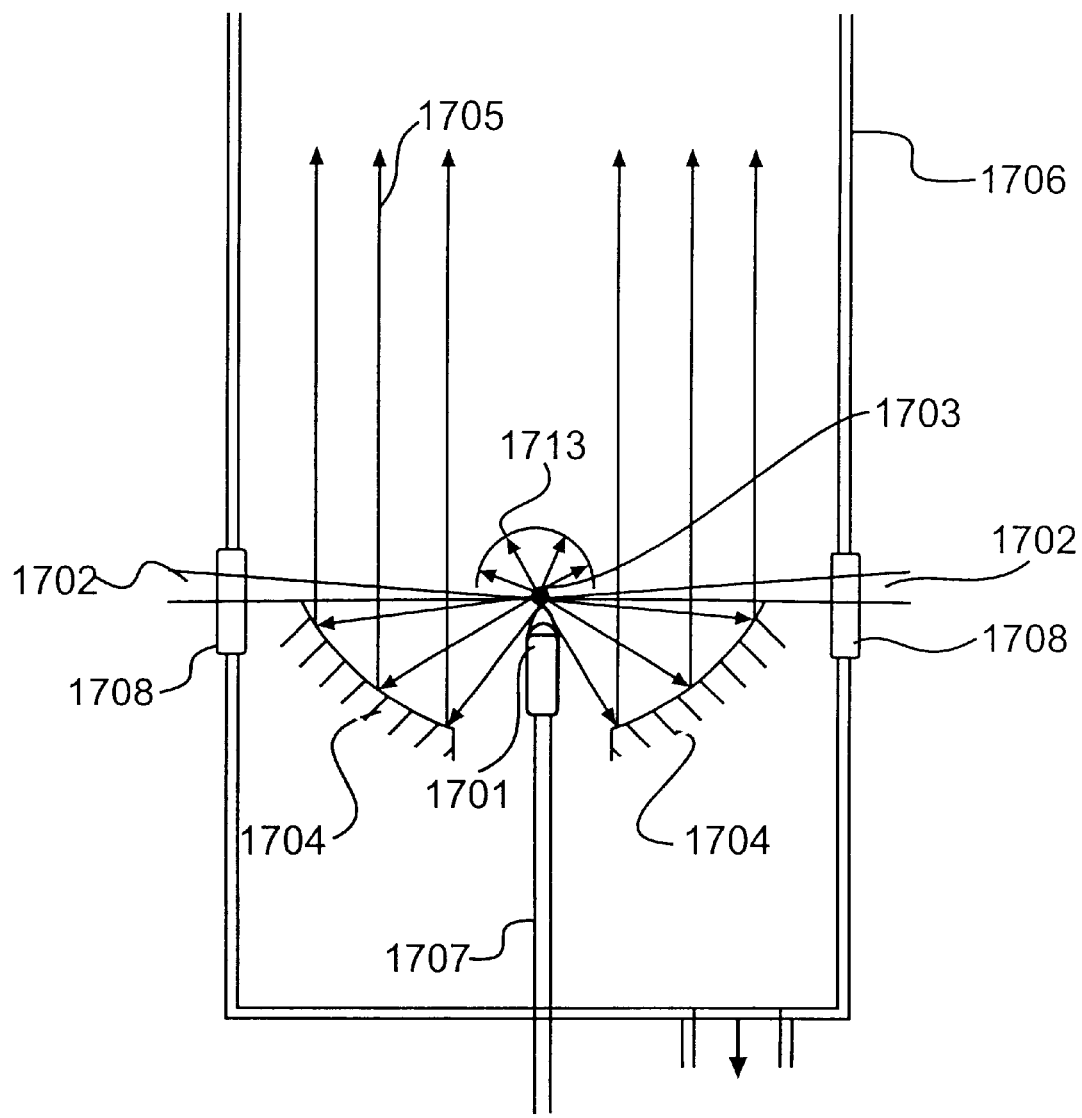

FIG. 17 shows a soft X-ray source using a gaseous target material of another embodiment of the present invention.

DETAILED DESCRIPTION OF THE PREFERRED EMBODIMENTS

Reference will now be made in detail to the preferred embodiments of the present invention, examples of which are illustrated in the accompanying drawings.

In the discussion that follows, the term "soft X-rays" refers radiation in a wavelength between about 0.1 nm and 300 nm.

Figure 1:
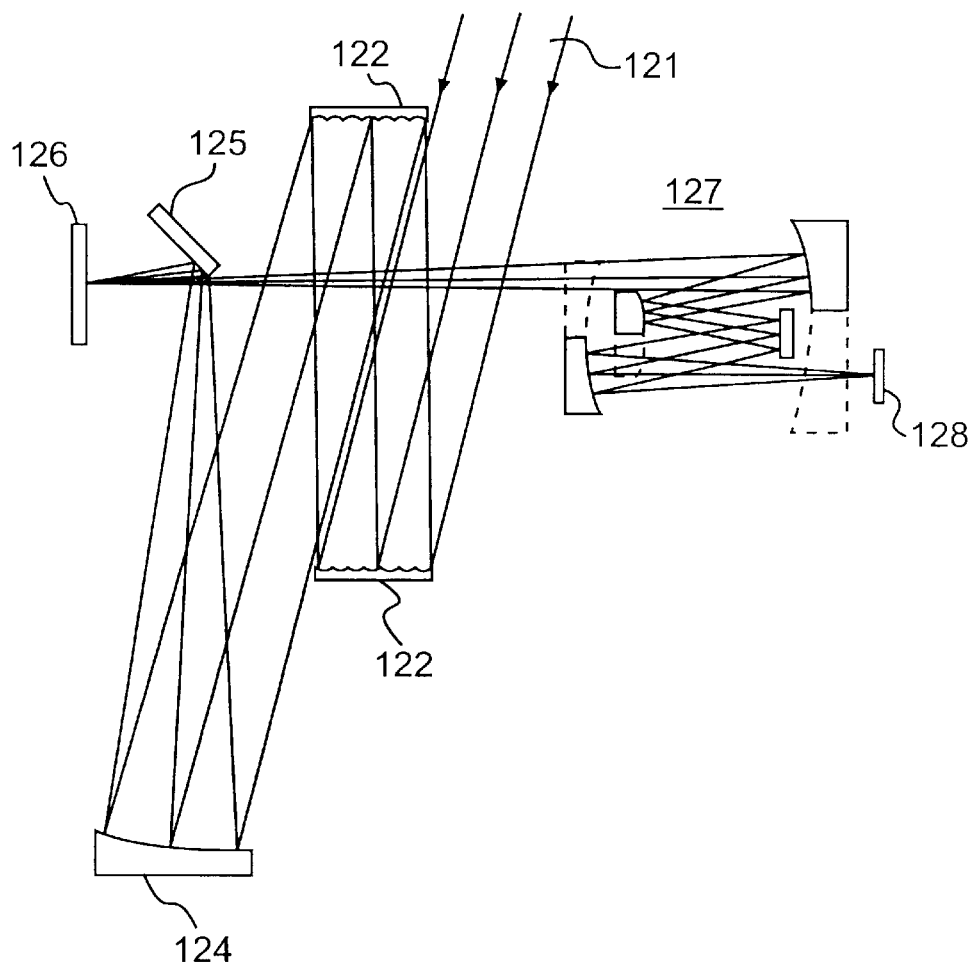
FIG. 1 shows a soft X-ray exposure apparatus.

Soft X-ray exposure is capable of producing complex and fine patterns close to the diffraction limit. Japanese Patent Application No. Hei. 10-047400, as illustrated in FIG. 1, shows an example of an X-ray illumination optical system. A soft X-ray source (not shown) generates parallel beams 121 of soft X-rays. The parallel beams 121 are reflected by an optical element 122 that effectively forms a plurality of light sources. Further, the parallel beams 121 are directed to a surface of a mask 126 via a focusing mirror 124 and a planar mirror 125. The surface of the mask 126 includes a pattern. The beams of soft X-rays are then reflected by the mask 126. The reflected beams are then directed by a reduction and projection optical system 127 (an exposure system). The exposure optical system reduces the pattern from the surface of the mask 126, and then projects the reduced pattern onto a surface of a silicon wafer 128.

Figure 2:
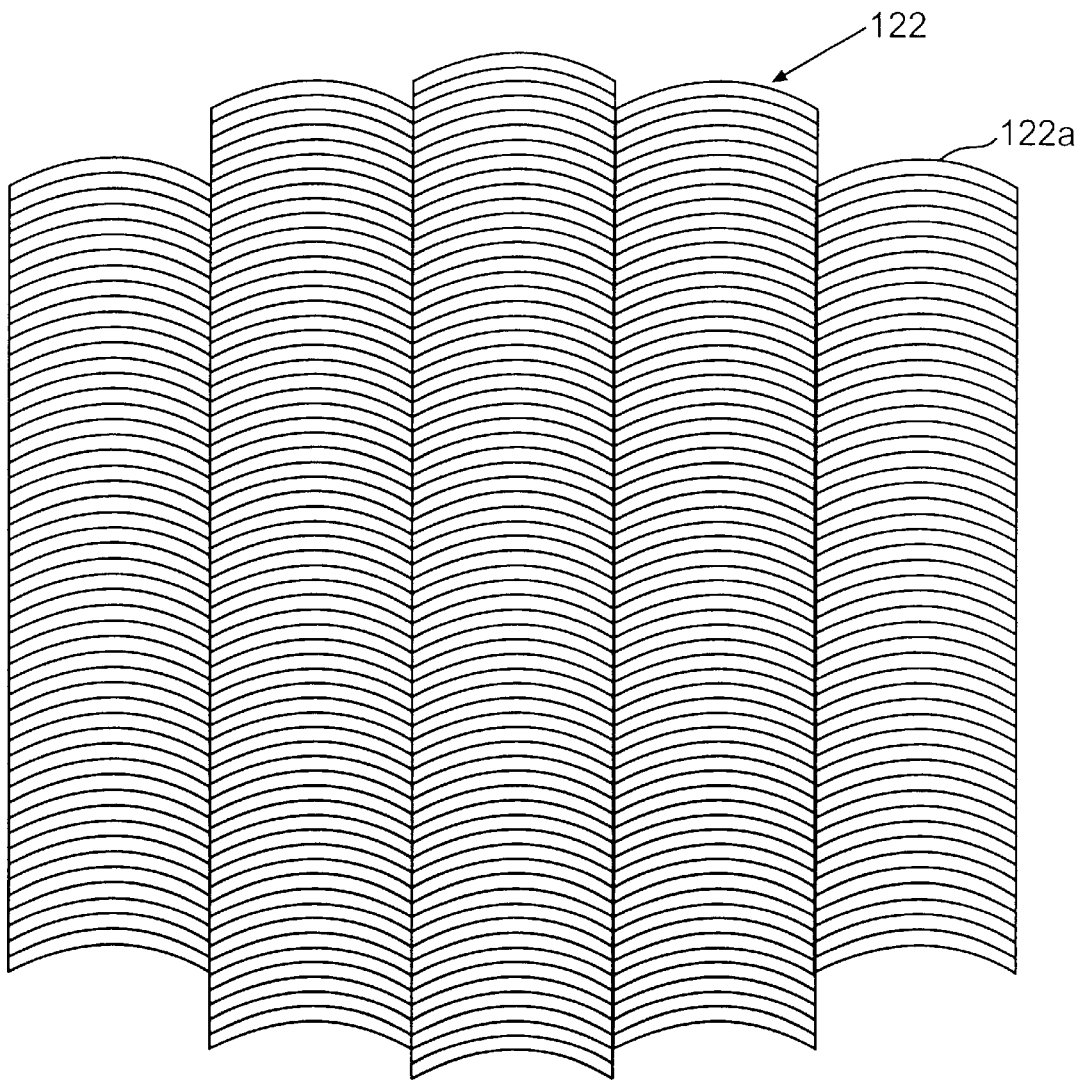
FIG. 2 shows an optical element in the form of a fly-eye mirror.

When the above type of illumination optical system is used in soft X-ray exposure, the projected region is in the shape of an annular band. A region of the surface of the mask 126 to be illuminated is also in the shape of an annular band. FIG. 2 illustrates the optical element 122, in the form of a fly-eye mirror, which is used to illuminate this region. A plurality of reflective units 122a is aligned to form a surface of the fly-eye mirror 122. Each reflective unit 122a is a substantially similarly sized arc having a reflective surface. These arcs are aligned such that they are substantially flush with one another. In this fashion, a reflective surface as illustrated in FIG. 2 is formed. The fly-eye mirror 122 is positioned such that the parallel beams 121 strike the region to be illuminated substantially uniformly, thereby reflecting a pattern with substantially equal intensity from the entire surface of the mask 126.

Figure 3:
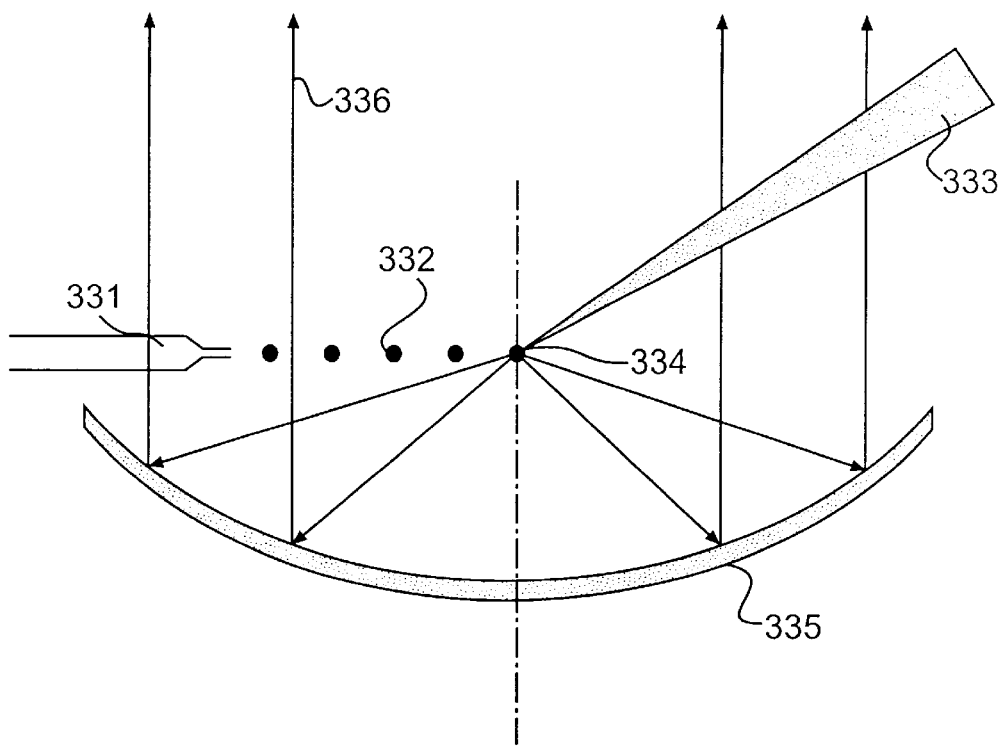
FIG. 3 shows a soft X-ray source using a liquid-droplet-form or solid-particle-form target material.

FIG. 3 illustrates a soft X-ray source used to generate soft X-rays with substantially parallel beams. Here, a liquid-droplet-form or solid-particle-form target material 332 is ejected from a nozzle 331. The target material 332 is irradiated by pulsed laser light 333, generating a plasma 334. The plasma 334 emits soft X-rays. The ejection of the target material 332 from the nozzle 331 is synchronized with a pulse of the pulsed laser light 333, such that target material 332 and the pulsed laser light 333 simultaneously arrive at a point where plasma is generated. This synchronization may be controlled by a computer (not shown). The point of plasma generation coincides with the focal point of a parabolic mirror 335. The parabolic mirror 335 is a paraboloid of revolution (i.e., is symmetric about an axis of rotation). The surface of the mirror 335 is coated with a multi-layer reflective film that has a high reflectivity with respect to soft X-rays. The soft X-rays incident on the mirror 335 are reflected by the surface of the mirror 335, forming parallel beams 336 of soft X-rays.

Figure 4:
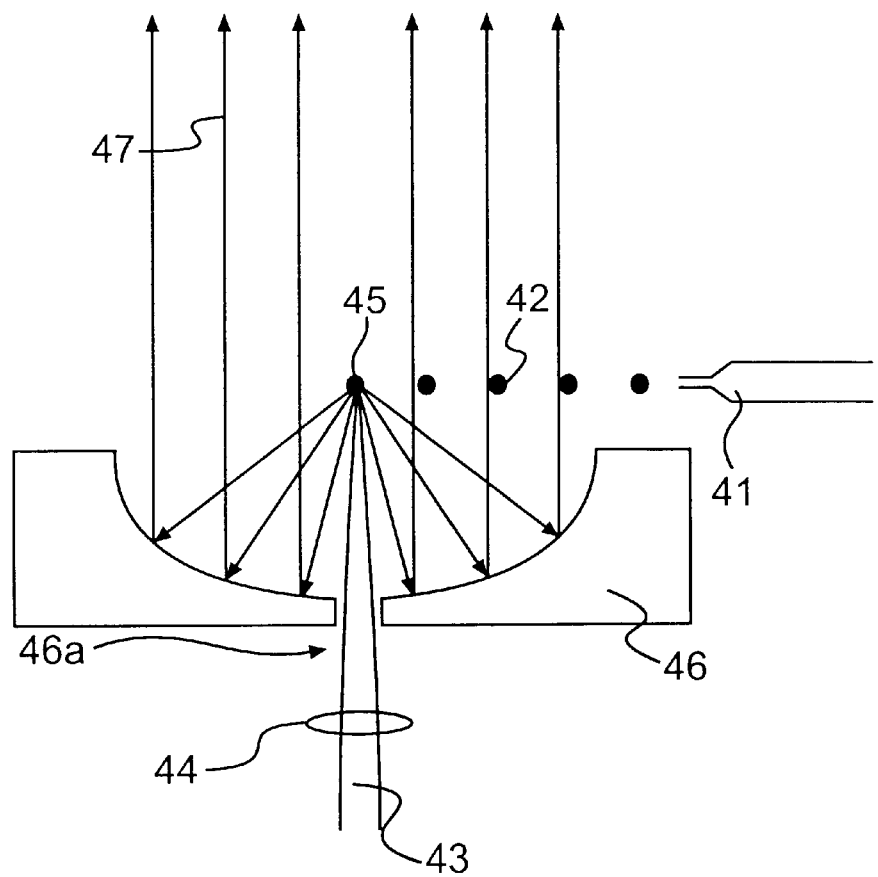
FIG. 4 shows a soft X-ray parallel beam source of the present invention that uses a liquid-droplet-form or solid-particle-form target material.

FIG. 4 shows one embodiment of a soft X-ray parallel beam source of the present invention which uses a liquid-droplet-form or solid-particle-form target material. A nozzle 41 is installed in a vacuum vessel (not shown). Water is supplied from a water source (not shown) to the nozzle 41. Water is ejected from the nozzle 41 to form water droplets 42, which is a target material for generation of soft X-rays. A pulsed laser light 43 is focused and directed to the water droplets 42 via a lens 44, forming a plasma 45. The plasma 45 emits soft X-rays. The soft X-rays are reflected by a parabolic mirror 46 that has a multi-layer reflective film on its surface. The plasma 45 is generated at approximately a focal point of the parabolic mirror 46. Consequently, the soft X-rays are reflected by the parabolic mirror 46 and form parallel beams 47. The parabolic mirror 46 includes a central hole 46a that coincides with the axis of symmetry of the parabolic mirror 46. The pulsed laser light 43 is directed through the central hole 46a, and the lens 44 is located outside the parabolic mirror 46. The ejection of the water droplets 42 from the nozzle 41 is synchronized with the pulsed laser light 43, such that the water droplets 42 and the pulsed laser light 43 simultaneously arrive at the position where plasma generation is desired. This synchronization may be controlled by a computer (not shown).

With this arrangement, the distribution of the soft X-rays generated from the plasma 45 is symmetrical with respect to an optical axis of the pulsed laser light 43 and an axis of symmetry of the parabolic mirror 46. Consequently, parallel beams 47 of soft X-rays are symmetrically distributed. Since a greater amount of soft X-rays are incident on the parabolic mirror 46, the intensity of the parallel beams 47 is increased. Additionally, the nozzle 41 does not affect the intensity distribution of the parallel beams 47, since it is located outside the path of the parallel beams 47.

Figure 5A:
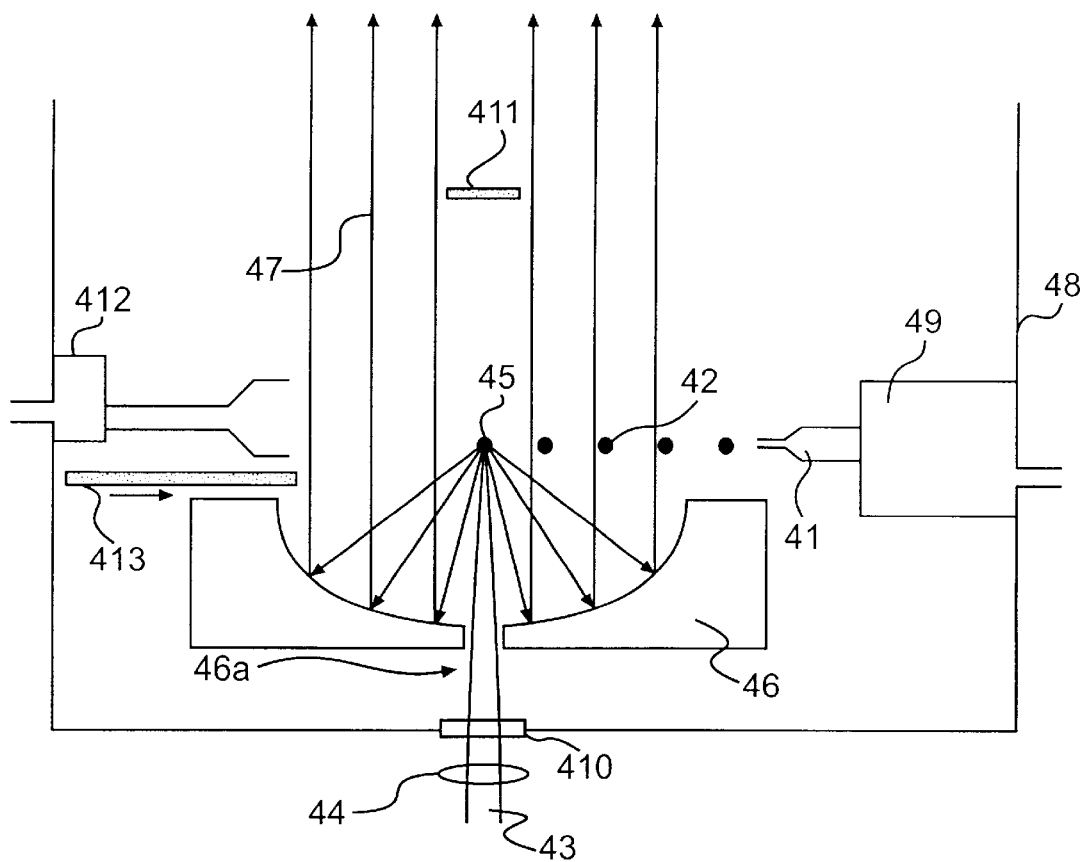
FIG. 5A shows an exposure apparatus using the soft X-ray parallel beam source of FIG. 4.

FIG. 5 illustrates an exposure apparatus which uses the soft X-ray source of FIG. 4. A water source 49 is located inside a vacuum vessel 48. Water is ejected from the nozzle 41 to form the water droplets 42 (the target material). Pulsed laser light 43 (for example, from an Nd:YAG laser) is focused and directed onto the water droplets 42 via the lens 44 through a window 410, forming the plasma 45. The plasma 45 emits the soft X-rays. The soft X-rays are reflected by the parabolic mirror 46, which is installed inside the vacuum vessel 48. The plasma 45 is generated at the focal point of the parabolic mirror 46. Consequently, the soft X-rays are reflected by the parabolic mirror 46 to form the parallel beams 47. The parabolic mirror 46 includes the central hole 46a that coincides with the axis of symmetry of the parabolic mirror 46. The pulsed laser light 43 is directed through the central hole 46a by the lens 44, which is located outside the parabolic mirror 46. The ejection of the water droplets 42 from the nozzle 41 is synchronized with the pulse of the pulsed laser light 43, such that the water droplets 42 and the pulsed laser light 43 simultaneously arrive at the point where plasma generation is desired. This synchronization may be controlled by a computer (not shown).

A circular screening plate 411 may be used to prevent undesired light, such as light of other wavelengths (for example, laser light), from impacting surfaces on which the parallel beams 47 may be incident. A water droplet recovery device 412 is installed in the vacuum vessel 48 in order to recover any water droplets 42 that are injected but not converted into a plasma. This is desirable, since upon injection of the water droplets 42 into the vacuum vessel 48, the locations of the water droplets 42 are not substantially predictable and constant. Therefore, until that time, a protective plate 413 is moved in the direction indicated by the arrow such that the surface of the parabolic mirror 46 is protected. The water droplets 42 are recovered by the water droplet recovery device 412. After the locations of the water droplets 42 have become substantially predictable and constant, the protective plate 413 is moved out of the path of the soft X-rays, and irradiation with pulsed laser light 43 is initiated again.

The angular distribution of the intensity of the soft X-rays emitted from the plasma depends on a number of factors, such as the size of the water droplets, the exact point of the plasma generation, etc. In this embodiment, the apparatus is configured such that the intensity has a distribution that is axially symmetrical with respect to an optical axis of the pulsed laser light 43, and the optical axis of the pulsed laser light 43 and the rotational symmetrical axis of the parabolic mirror 46 are substantially the same. Additionally, there is no blockage of the parallel beams 47 except for that due to the circular screening plate 411. Thus, the intensity distribution of the parallel beams 47 reflected by the parabolic mirror 46 is made axially symmetrical. When the screening plate 411 is supported by an extremely thin support wire (not shown), the support wire does not substantially interfere with the symmetrical distribution.

In the present embodiment, the water droplets 42 are used as a target material. However, the choice of target materials is not limited to water droplets, or to a liquid. Solid materials which are crushed or otherwise reduced to fine particles may also be used. A gas may be cooled or compressed such that it is injected in a solid or a liquid form. A solid target material may be melted into a liquid to form a target material at the time of plasma generation. It should also be noted that the parabolic mirror 46 is not limited to the use of a multi-layer reflective film to form the parallel beams 47 of the soft X-rays.

Figure 5B:
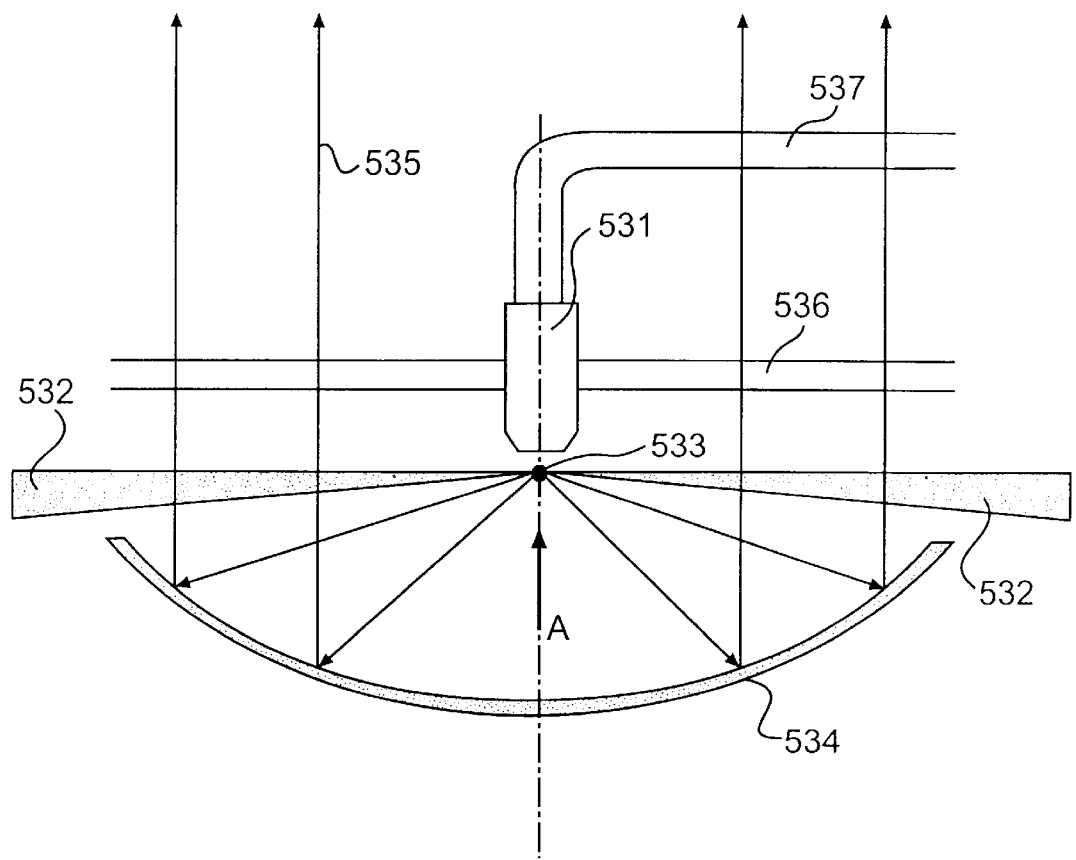
FIGS. 5B and 5C show an embodiment of a soft X-ray parallel beam source with a nozzle directed towards a parabolic mirror and two pulsed laser beams generating a plasma.
Figure 5C:
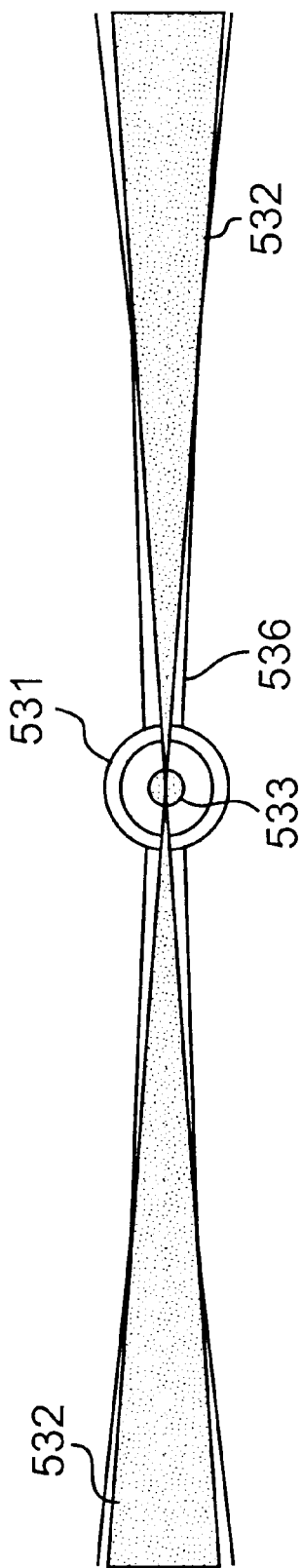

FIGS. 5B and 5C illustrate an embodiment of a soft X-ray source with a nozzle directed towards a parabolic mirror, and two pulsed laser beams used to excite a plasma. Unlike the previous embodiment, the target material is typically a gas, rather than a solid or a liquid. FIG. 5B is a schematic longitudinal section of the X-ray generating source, while FIG. 5C shows a view of the nozzle from a direction A of FIG. 5B. In FIGS. 5B and 5C, a target gas supply nozzle 531 is disposed in a vacuum vessel (not shown in the figures), and a high-pressure gas (e.g., krypton) supplied from a gas supply pipe 537 jets from the nozzle 531. Two beams of pulsed laser light 532 is focused and directed towards the gas jet. The gas undergoes adiabatic expansion, and a temperature of the gas drops and the gas forms clusters. A plasma 533 is generated by irradiating these clusters the pulsed laser light 532, and soft X-rays are emitted from this plasma 533. The position at which the plasma 533 is generated is located at a focal point of a parabolic mirror 534 that has a multi-layer reflective film on its surface. The soft X-rays are reflected by the parabolic mirror 534, forming a parallel X-ray beam 535.

The embodiment also includes a supporting member 536 for the nozzle 531, and a gas supply pipe 537 that supplies gas to the nozzle 531. It is often difficult to install these components so that they do not block the parallel X-ray beam 535, and a shadow of these components blocks a portion of the parallel beam 535 extends in one direction, reducing uniformity of the illumination intensity on a surface of a photosensitive substrate being exposed.

Figure 6A:
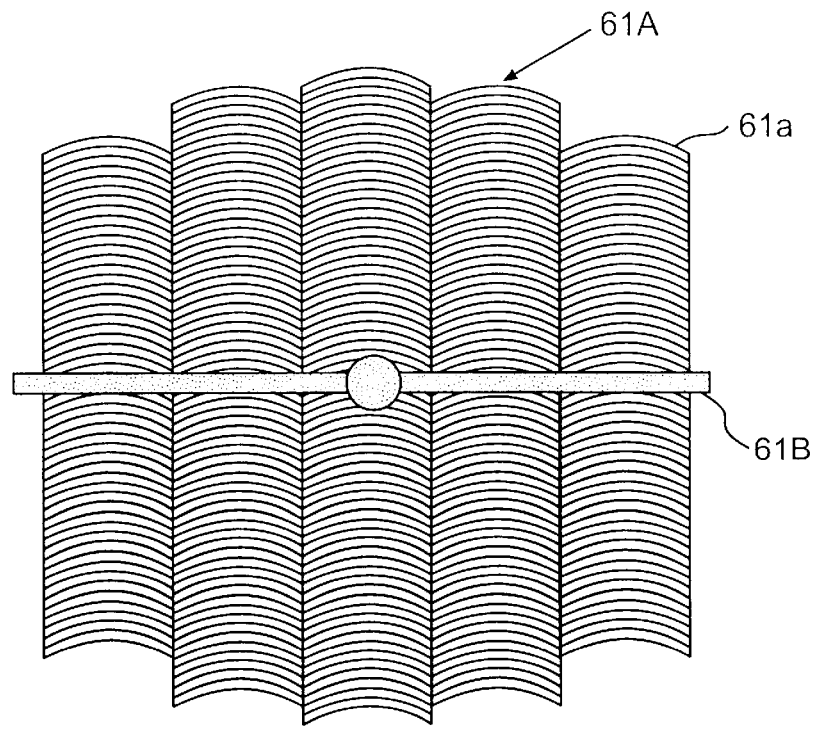
FIG. 6A shows a configuration of an optical system according to the present invention with a shadow formed by a nozzle that a eject a gaseous target material.
Figure 6B:
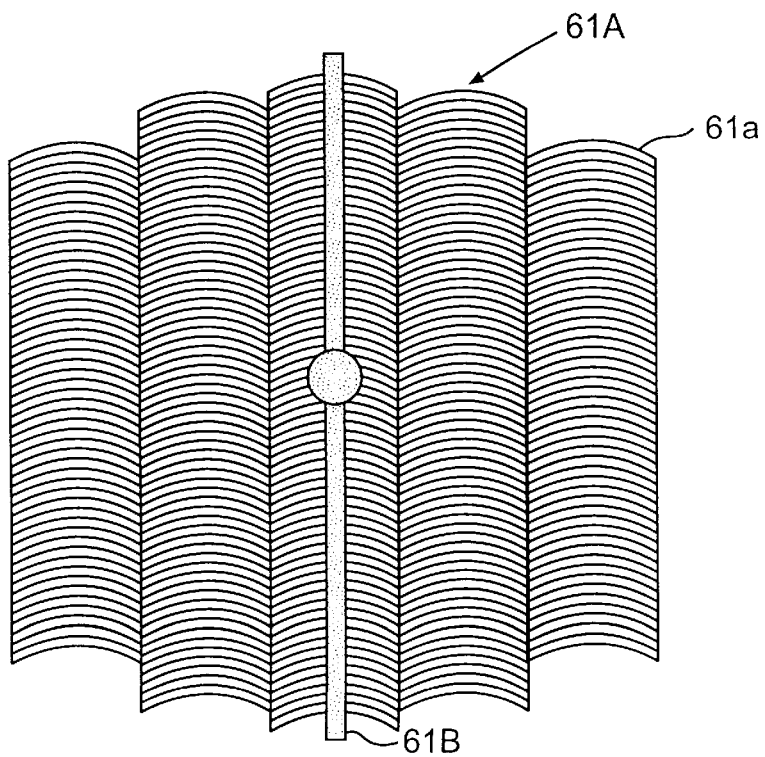
FIG. 6B shows a comparative example with respect to FIG. 6A.

FIGS. 6A and 6B show shadows formed by a nozzle that ejects a gaseous target material in a fly-eye mirror. FIG. 6A shows an example of an embodiment of the present invention, while FIG. 6B shows a comparative example. A projection optical system in the form of a fly-eye mirror 61A is formed from a plurality of reflective units 61a. Each reflective unit 61a is a substantially similarly sized arc with a multi-layer reflective film on its surface. The arc is formed by cutting a ring and extracting a portion of the ring. These arcs are aligned in a longitudinal direction such that they are substantially flush with one another, forming a row of desired length. A plurality of rows is then aligned in a lateral direction such that they are substantially flush with one another. Typically, the number of reflective units 61a aligned in the longitudinal direction is much greater than the number of reflective units 61a aligned in the lateral direction.

As seen in FIG. 6A, a shadow 61B is formed on the fly-eye mirror 61A. The shadow 61B has a shape which extends substantially in one direction. The shadow 61B is formed as a result of using a nozzle to eject a gaseous target material. The extended portion of the shadow 61B is formed by a nozzle supporting member. The central, circular portion of the shadow 61B is formed by the nozzle.

As shown in FIG. 6A, the nozzle supporting member of the present invention is configured such that the extended portion of the shadow 61B coincides with the lateral direction of the fly-eye mirror 61A. In this orientation, the number of reflective units 61a on which the shadow 6lB falls is minimized. Consequently, the number of reflective units 61a affected by the shadow 61B is small relative to the total number of reflective units 61a. Accordingly, the deviation from uniform illumination is also small.

With the configuration shown in FIG. 6B, however, the extended portion of the shadow 61B coincides with the longitudinal direction of the fly-eye mirror 61A. In this orientation, the number of reflective units 61a on which the shadow 61B falls is greater than in the example of FIG. 6A. Consequently, the deviation from uniform illumination is increased, which is undesirable.

Figure 7:
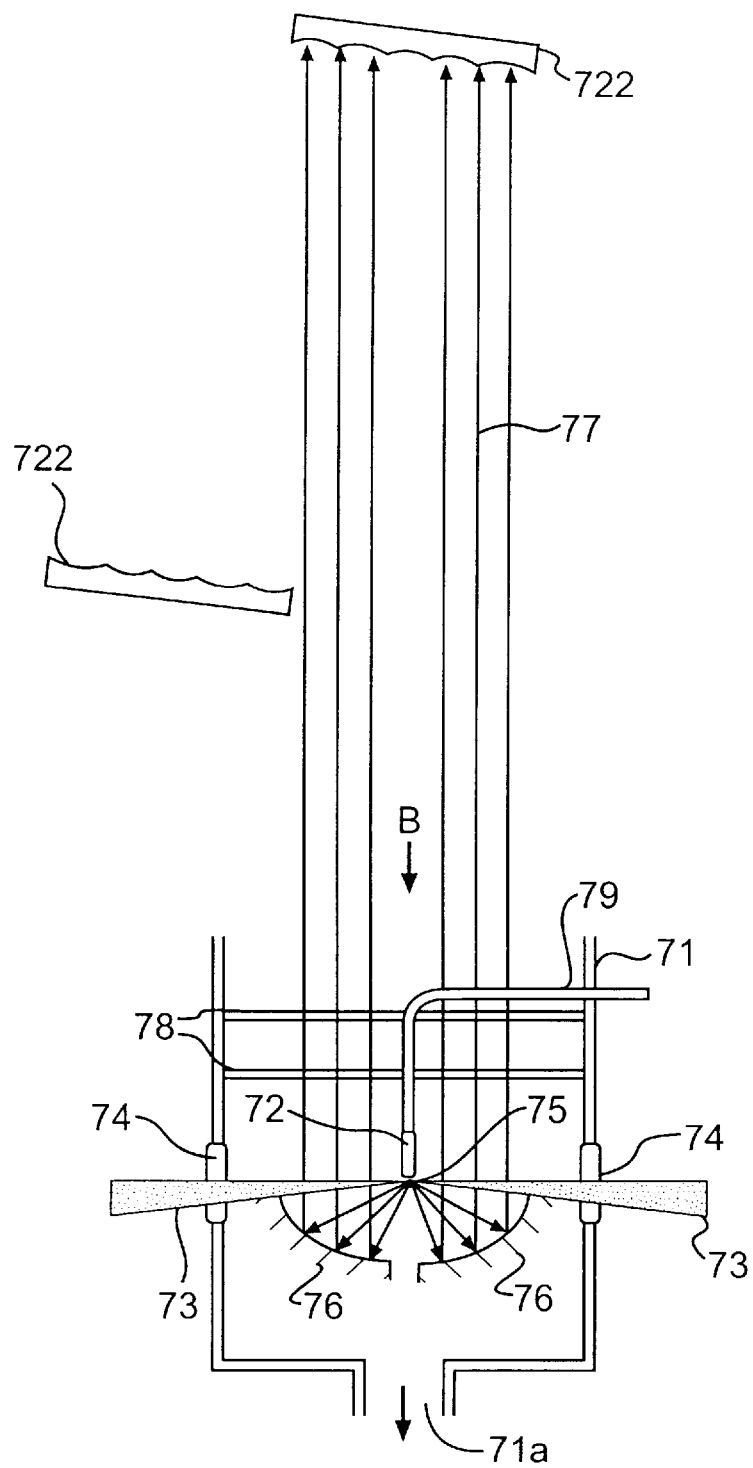
FIG. 7 shows a soft X-ray illumination apparatus of the present invention that provides a substantially uniform soft X-ray distribution.
Figure 8:
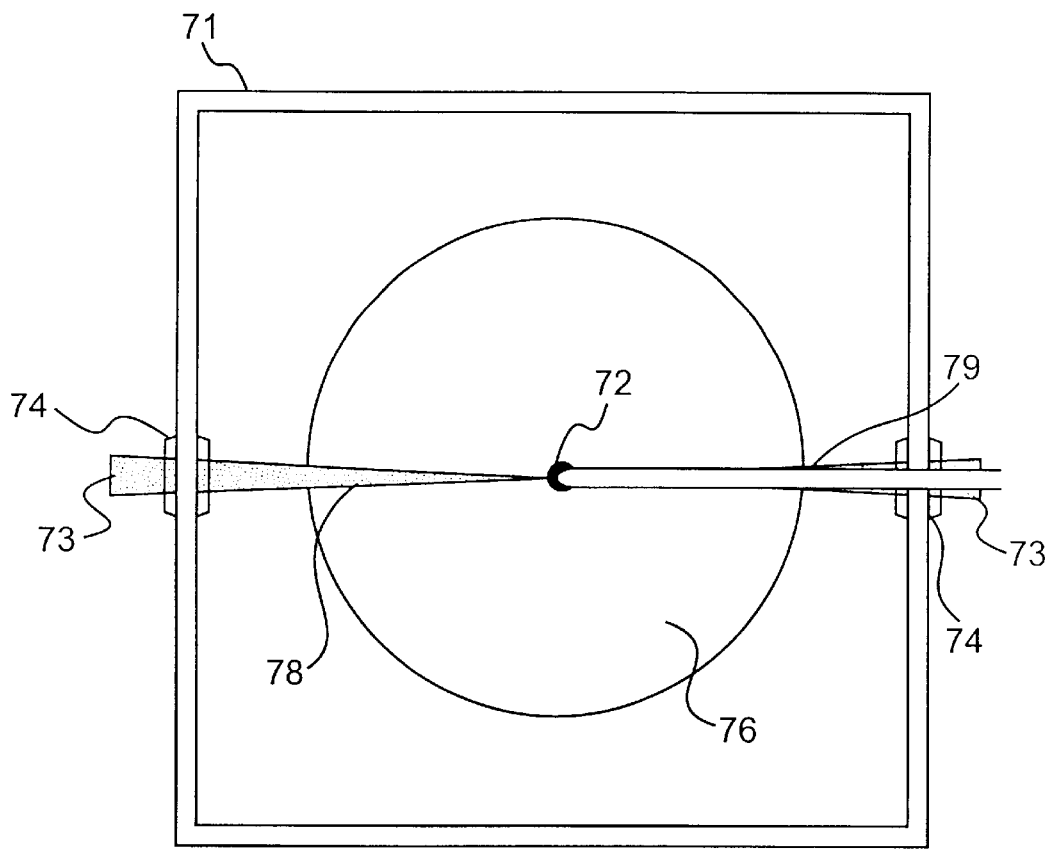
FIG. 8 shows a plan view of the soft X-ray illumination apparatus of FIG. 7.

FIGS. 7 and 8 show an embodiment of a soft X-ray illumination apparatus of the present invention that provides a substantially uniform soft X-ray distribution. FIG. 7 shows an elevation view of the apparatus, while FIG. 8 shows the apparatus as viewed in a direction B of FIG. 7.

A target gas supply nozzle 72 is installed inside a vacuum vessel 71, and high-pressure krypton (Kr) gas is supplied to the nozzle 72 via a gas supply pipe 79. The gas ejected from the nozzle 72 rapidly diffuses. Excess gas is discharged from an exhaust port 71a at a lower end of FIG. 7. Liquid nitrogen traps (not shown) are installed inside the vacuum vessel 71 at a location above the exhaust port 71a, such that the excess gas can be solidified and recovered.

The interior of the vacuum vessel 71 is maintained at a pressure of about 0.1 Torr or less using a vacuum pump. Pulsed laser beams 73 from two directions (for example, from an Nd:YAG laser) are introduced through windows 74. The pulsed laser beams 73 are focused at approximately 1 mm from an opening of the nozzle 72. The pulsed laser beams 73 are obtained by splitting pulsed light emitted from a single laser into two equal beams using a beam splitter.

The target gas is converted into a plasma 75 by the pulsed laser beams 73. The soft X-rays emitted from the plasma 75 are reflected by a parabolic mirror 76 that has a multi-layer reflective film on its surface. The plasma 75 is generated at approximately a focal point of the parabolic mirror 76. The soft X-rays are converted into parallel beams 77 by reflection off the parabolic mirror 76. The parallel beams 77 may now be used with a soft X-ray exposure apparatus. In FIG. 7, only part of a soft X-ray exposure apparatus is shown, that part being optical elements in the form of a fly-eye mirror 722.

The nozzle 72 is positioned near a nozzle supporting member 78. The nozzle 72, the nozzle supporting member 78, and the gas supply pipe 79 are located such that a portion of the parallel beams 77 are obstructed. The nozzle supporting member 78 and the gas supply pipe 79 are disposed and oriented such that a shadow is formed as shown in FIG. 6A. Consequently, the deviation from uniform illumination is small when a mask used for soft X-ray exposure is illuminated.

Figure 9A:
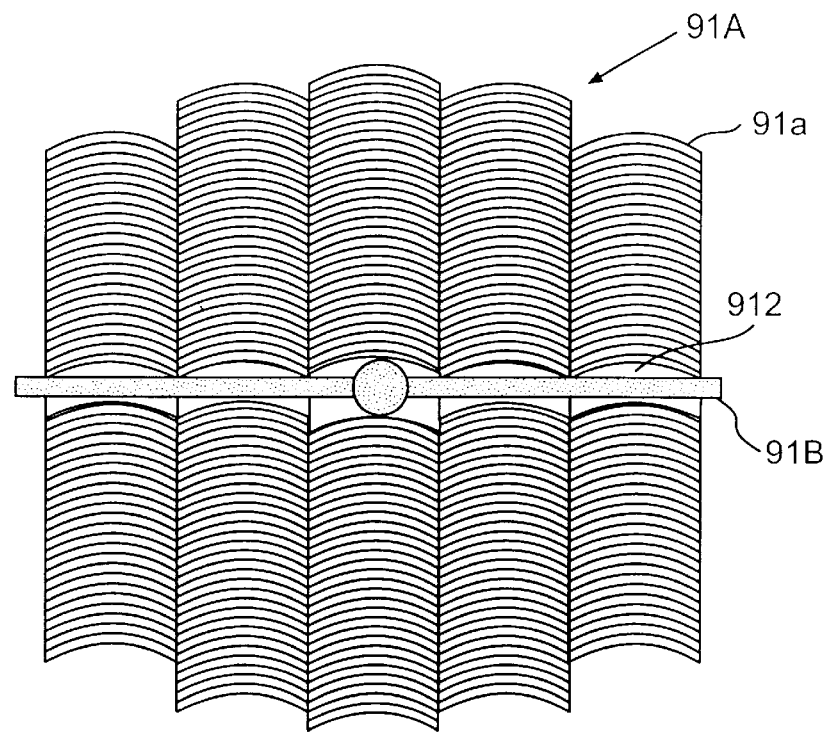
FIGS. 9A and 9B show shadows formed by nozzles that eject a gaseous target material onto an improved optical system of the present invention.
Figure 9B:
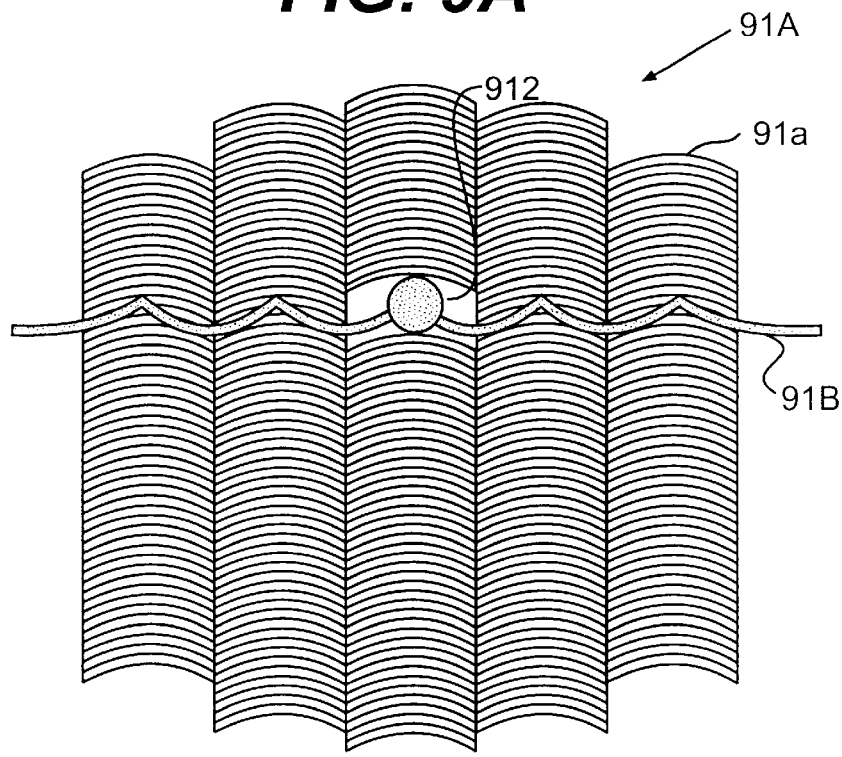

FIGS. 9A and 9B show other examples of the configurations according to the present invention. In FIGS. 9A and 9B, 91A indicates a fly-eye mirror, 91a indicates reflective units, and 91B indicates a shadow. The fly-eye mirror 91A differs from the fly-eye mirror 61A shown in FIGS. 6A and 6B in that it includes non-reflective areas 912.

In FIG. 9A, the non-reflective areas 912 are included along the entire region on which shadow 91B falls. The proportion of the light beam incident on the fly-eye mirror 91A used for illumination drops slightly, if such an arrangement is used. However, since the shadow 91B does not fall on any of the reflective units 91a, there is no shadow effect on the uniformity of illumination. In this embodiment, the number of reflective units 91a omitted in order to form the non-reflective areas 912 may be minimized by having an extended portion of the shadow 91B coincide with a lateral direction of the fly-eye mirror 91A.

Further, if the shape of the nozzle supporting member 78 and the gas supply pipe 79 is substantially the same as the shape of the reflective units 91a, as shown in FIG. 9B, the number of reflective units 91a contributing to illumination can be increased. In this example, the reflective units 91a are omitted from a region on which the shadow 91B falls, so that this region does not contribute to the X-ray illumination. This region can also be prevented from contributing to the illumination by omitting from the surfaces of these reflective units 91a the multi-layer reflective film used to reflect soft X-rays, by removing the multi-layer reflective film after it is formed, or by covering some of the reflective units 91a with a film that does not reflect soft X-rays.

In the embodiment of FIG. 7, the nozzle 72, the nozzle supporting member 78 and the gas supply pipe 79 block the parallel beams 77 of soft X-rays. However, in cases where other structural components (for example, support members for a screening element that blocks some of the soft X-rays, etc.) obstruct the parallel beams 77, uniformity of illumination may be improved by positioning and orienting these structural components such that the shadow from these structural components most substantially extends in one direction, and positioning and orienting the shadow with respect to the fly-eye mirror 722 in the manner described above.

Preferably, the nozzle 72 is disposed so that it does not block the parallel beams 77 in an asymmetrical manner. The plasma 75 is formed in a more symmetrical shape by simultaneously irradiating the gas with laser light from a plurality of directions.

Figure 10:
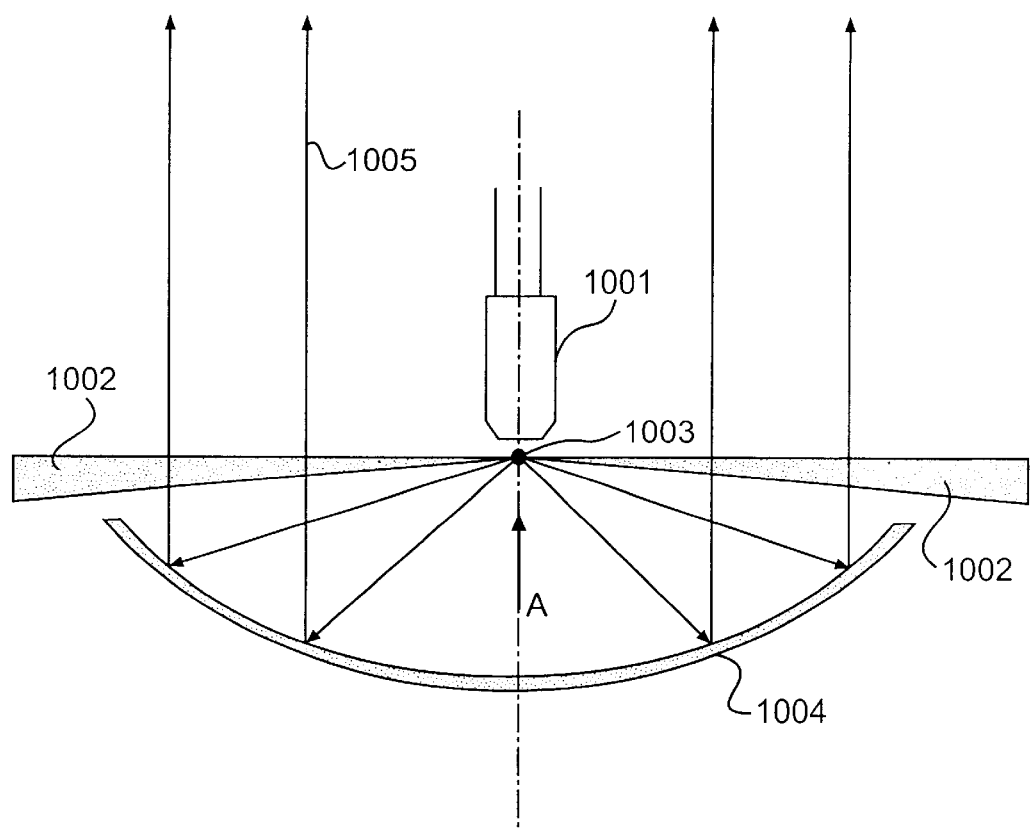
FIG. 10 shows a view of a soft X-ray source of the present invention that uses a gaseous target material.
Figure 11:
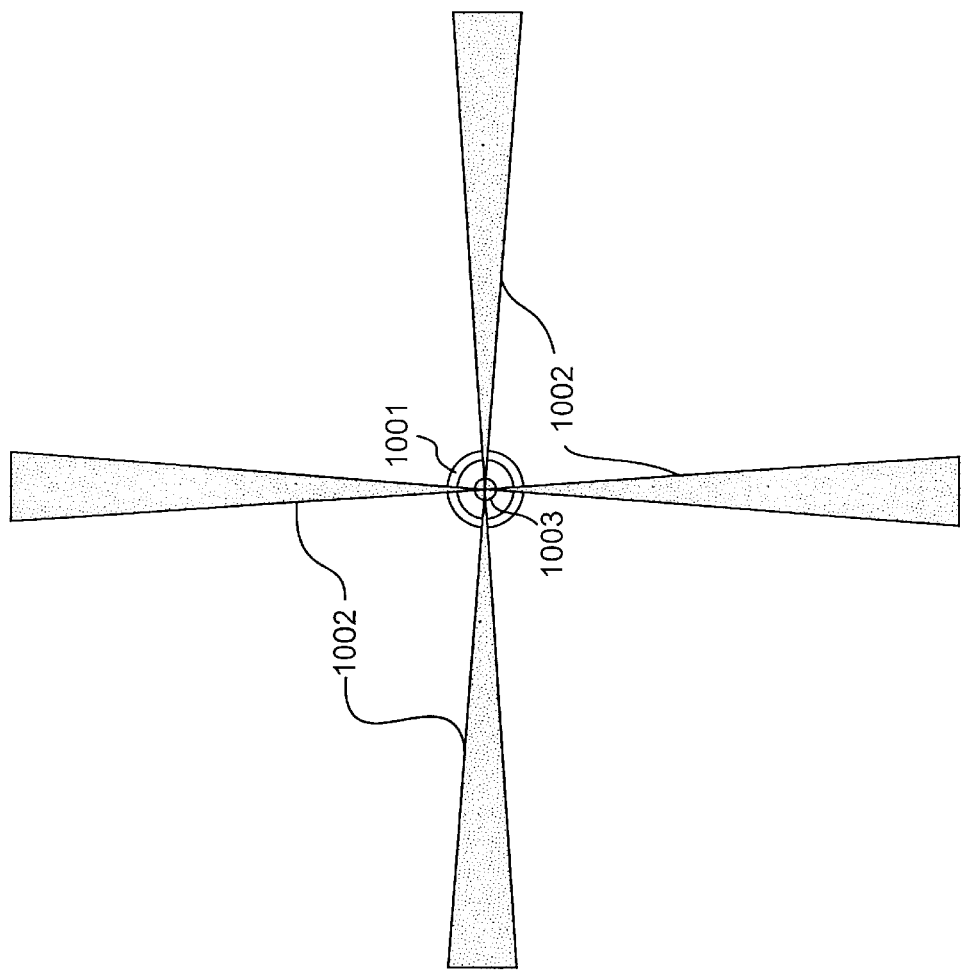
FIG. 11 shows a top view of the soft X-ray source of FIG. 10.

FIG. 10 shows an elevation view of another embodiment of a soft X-ray generating apparatus using a gaseous target material of the present invention, and FIG. 11 is a view taken from position A of FIG. 10.

A target gas supply nozzle 1001 is located in a vacuum vessel (not shown). The nozzle 1001 has a substantially symmetrical shape. The nozzle 1001 is arranged such that pulsed laser light 1002 may be focused and directed towards a location where the gas is ejected from the nozzle 1001. The ejected gas undergoes adiabatic expansion and a resulting drop in temperature. Consequently, gas clusters are formed. The irradiation of these clusters with pulsed laser light 1002 generates a plasma 1003. Soft X-rays are emitted from the plasma 1003. The plasma 1003 is generated substantially at a focal point of a parabolic mirror 1004 that has a multi-layer reflective film on its surface. The nozzle 1001 is axially symmetric with respect to its own axis of symmetry and the axis of symmetry of the parabolic mirror 1004. These soft X-rays are reflected by the parabolic mirror 1004 and converted into parallel beams 1005 of soft X-rays.

The pulsed laser light 1002 irradiates the target material simultaneously from four directions at equal angular intervals (90°). When the target material is irradiated with a single pulsed laser beam the angular distribution of the intensity of the soft X-rays is biased toward that side. When the target material is irradiated from four directions as described above, a soft X-ray intensity distribution is obtained that is symmetrical with respect to the axis of the nozzle 1001. Plasma which is symmetrical with respect to an axis of symmetry of the nozzle 1001 may be produced by providing a pulsed laser light in the direction of arrow A. However, the laser light would impact the nozzle 1001 unless the light was completely absorbed by the gas.

FIG. 12. show a diagram illustrating an undesirable position for a nozzle 1201 and a pulsed laser light 1202. In this orientation, soft X-rays generated from the plasma 1203 are reflected as parallel beams 1205 by a parabolic mirror 1204 that has a multi-layer reflective film on its surface. However, the parallel beams 1205 are obstructed by the nozzle 1201 in a manner that is asymmetrical with respect to an axis of symmetry of the parabolic mirror 1204. When the nozzle 1201 is not sufficiently thin, this asymmetry affects the distribution intensity of the soft X-rays. Additionally, the pulsed laser light 1202 that is not absorbed by the target material impacts the nozzle 1201. As a result, the nozzle 1201 is ablated by the pulsed laser light 1202.

In contrast, FIGS. 10 and 11 show the nozzle 1001 positioned on the axis of symmetry of the parabolic mirror 1004. The nozzle 1001 does not block the parallel beams 1005 in an asymmetrical manner, and no material is ablated from the nozzle 1001. Accordingly, axially symmetrical parallel beams 1005 may be obtained. Since the pulsed laser light 1002 does not strike the nozzle 1001, the arrangement of FIG. 10 is preferred.

FIGS. 13 and 14 show another embodiment of a soft X-ray generating apparatus using a gaseous target material. FIG. 13 shows an elevation view, and FIG. 14 shows a view of the device of FIG. 13 looking in a direction B.

A target gas supply nozzle 1301 is installed inside a vacuum vessel 1306, and high-pressure krypton (Kr) gas is supplied to the nozzle 1301 via a gas supply pipe 1307. Gas ejected from the nozzle 1301 rapidly diffuses. Excess gas is discharged from an exhaust port 1306a at a lower end of FIG. 13. Liquid nitrogen traps (not shown) are installed inside the vacuum vessel 1306 at a location above the exhaust port 1306a, such that the excess gas can be solidified and recovered.

The interior of the vacuum vessel 1306 is maintained at a pressure of about 0.1 Torr or less by use of a vacuum pump. Pulsed laser beams 1302 from four directions (generated by, for example, an Nd:YAG laser) are introduced through windows 1308. The pulsed laser beams 1302 are focused at a position approximately 1 mm from an opening of the nozzle 1301. The pulsed laser beams 1302 are obtained from a single laser by splitting a single laser beam into four equal beams using a beam splitter. The pulsed laser beams 1302 are positioned such that the optical axes of the four laser beams 1302 differ. This prevents any light passing through plasma 1303 from traveling back along an optical axis of the laser and destroying the laser.

Soft X-rays emitted from a plasma 1303 are reflected by a parabolic mirror 1304 that has a multi-layer reflective film on its surface. The plasma 1303 is generated at substantially a focal point of the parabolic mirror 1304. The soft X-rays are reflected by the parabolic mirror 1304, forming parallel beams 1305. The parabolic mirror 1304 includes four apertures. The pulsed laser beams 1302 passes through these four apertures of the parabolic mirror 1304. The pulsed laser beams 1302 are not completely axially symmetrical, but rather are divided into four fan-shaped beams.

The nozzle 1301 is attached to supporting columns 1309. The supporting columns 1309 are located among the four fan-shaped portions of the pulsed laser light beam 1302. A gas supply pipe 1307 that supplies gas to the nozzle 1301 is similarly located, such that it does not block the pulsed laser beams 1302.

The pulsed laser beams 1302 irradiate the target material after passing though apertures in the parabolic mirror 1304. This configuration eliminates the danger that laser light not absorbed by the gas will impact the nozzle 1301 or the parabolic mirror 1304.

The nozzle 1301 is located within the parallel beams 1305, and obstructs a portion of the parallel beams 1305. Thus, it is desirable to use a nozzle with a minimum cross-sectional area in a direction perpendicular to an axis of symmetry of the parabolic mirror 1304. Additionally, it is also desirable to use supporting columns 1309 with a minimum cross-sectional area, but of sufficient strength, to position the nozzle 1301.

In the present embodiment, the direction of the reflected parallel beams is opposite that of the gaseous target material ejected from the nozzle 1031. However, the direction may be configured to be the same as that of the gaseous target material upon ejection from the nozzle 1301, as describe below.

FIG. 15 shows an elevation view of a soft X-ray generating apparatus using a gaseous target material of another embodiment of the present invention, and FIG. 16 shows a bottom view of a soft X-ray filter of FIG. 15.

As shown in FIGS. 15 and 16, a direction of reflected parallel beams 1505 of soft X-rays is the same as the direction of the target material when ejected from a nozzle 1501. A portion of the soft X-rays emitted from a plasma 1503 does not form parallel beams 1505. A soft X-ray filter 1510 limits the escape of non-reflected soft X-rays.

As in the previous embodiment, the nozzle 1501 is located inside a vacuum vessel 1506. A gaseous target material, for example, high-pressure krypton (Kr) gas, is delivered to the nozzle 1501 via a gas supply pipe 1507. Pulsed laser light 1502 from four directions is focused through windows 1508 on the gas ejected from the nozzle 1501, generating a plasma 1503. The recovery of the excess krypton gas using liquid nitrogen traps, and the reflection of the soft X-rays radiated from the plasma 1503 into parallel beams 1505 using a parabolic mirror 1504 that has a multi-layer reflective film on its surface, are the same as in the previous embodiment.

The present embodiment differs from the previous embodiment in that the direction in which the krypton gas is ejected from the nozzle 1501 is the same as the direction of travel of the reflected parallel beams 1505. In the present embodiment, it is desirable that the tip end portion of the nozzle 1501 be thin. This minimizes the amount of soft X-rays blocked by the nozzle 1501. Additionally, a soft X-ray filter 1510 limits escape of non-reflected soft X-rays.

FIG. 16 shows a bottom view of the soft X-ray filter 1510 of FIG. 15. The soft X-ray filter 1510 includes an X-ray transmitter 1511 and an X-ray blocker 1512. Soft X-rays emitted from the plasma 1503 toward the periphery are absorbed by the vacuum vessel 1506 (for example, by the walls, etc.), and therefore do not escape outside the X-ray generating apparatus. Accordingly, there is no need to block these soft X-rays. The outermost portion of the soft X-ray filter 1510 includes the X-ray transmitter 1511, which allows the parallel beams 1505 to pass through unobstructed. The X-ray transmitter 1511 is formed, for example, of a silicon thin film, which has a thickness of about 1 $\mu$m or less. This type of silicon thin film has a high transmissivity of soft X-rays having a wavelength of about 13 nm. Therefore, the parallel beams 1505 will pass through the X-ray transmitter 1511 unobstructed.

Among the soft X-rays emitted from the plasma 1503, some X-rays are not reflected from the parabolic mirror 1504. These soft X-rays are not necessarily parallel to the parallel beams 1505 of reflected soft X-rays. The X-ray blocker 1512 is disposed on the soft X-ray filter 1510 to limit the escape of these soft X-rays. The X-ray blocker 1512 is formed of a metallic thin film, for example.

FIG. 17 shows a soft X-ray generating apparatus of another embodiment of the present invention. This embodiment shares a number of similarities with the previous embodiment. Particularly, a nozzle 1701 is located inside a vacuum vessel 1706. A gaseous target material, for example, high-pressure krypton (Kr) gas, is delivered to the nozzle 1701 via a gas supply pipe 1707. Pulsed laser light 1702 from four directions is focused through windows 1708 on the gas ejected from the nozzle 1701, generating a plasma 1703. The recovery of the excess krypton gas using liquid nitrogen traps, and the reflection of the soft X-rays radiated from the plasma 1703 into parallel beams 1705 using a parabolic mirror 1704 that has a multi-layer reflecting film on its surface are the same as in the previous embodiment.

In this embodiment, a substantially hemispherical reflective mirror 1713 coated with a multi-layer reflective film is used in place of the soft X-ray filter 1510 of the previous embodiment. The center of the reflective mirror 1713 is located near the position of generation of plasma 1703. The reflective mirror 1713 prevents unreflected soft X-rays and reflected parallel beams 1705 from impacting optical elements (not shown). The reflective mirror 1713 also reflects the soft X-rays back to or near the position of plasma generation.

When the soft X-rays are reflected back to the point of plasma generation, the plasma 1703 is reheated. A higher temperature is maintained, resulting in an increase in the quantity of soft X-rays emitted from the plasma 1703.

When the soft X-rays are reflected back to the point of plasma generation, a portion of the soft X-rays will travel in a direction such that they are subsequently reflected from the parabolic mirror 1704, thereby forming parallel beams 1705 of soft X-rays.

In the above embodiments, where the gas is ejected from the nozzle in a continuous stream, it is also possible to eject the gas in an intermittent stream. In such a case, the pulsing of the laser light should be synchronized with the ejection of gas from the nozzle. Such an embodiment may be useful in the situation where the exhaust rate of the vacuum pump is insufficient to insure sufficient soft X-ray transmissivity, for example.

In the above embodiments, where the target, as is irradiated with pulsed laser beams from four directions, the number of irradiation directions is not limited to four. In some cases, nonuniformity of plasma generation is not a concern. In that case, irradiation may be effected from only one direction, for example.

In the above embodiments, where a single laser light beam is divided into four equal beams, which are focused at the position of plasma generation, beams generated from separate lasers may also be used. Synchronization between the lasers is desirable, however. Additionally, it is desirable that the intensities of the laser beams be adjusted so that the plasma is substantially symmetrical with respect to the axis of the multi-layer film mirror. If such a plasma can be formed, then it is not necessary that the wavelengths of the respective laser beams be the same.

In the above embodiments, where the target gas is irradiated with the laser beams simultaneously, irradiation of the target gas by multiple laser beams need not, in fact, be simultaneous. For example, if soft X-rays emitted from the plasma are converted into the parallel beams, a given point on a mask is intermittently irradiated several times to several tens of times, for example, since the laser light source is a pulsed laser. Uniformity of irradiation requires that the irradiation intensity integrated over time for each position on the mask is uniform. Accordingly, it is sufficient if the integrated values of the irradiation intensities of the respective laser beams are averaged during this irradiation performed several times to several tens of times, so that the mask is uniformly irradiated.

In the above embodiment, where a parabolic mirror with four apertures is used to form the laser light into four beams, the number of apertures included in the parabolic mirror is not limited to this number.

In the above embodiments, where krypton (Kr) gas is used to generate the plasma, it is also possible to use xenon (Xe) gas, oxygen ($O_2$) gas, a compound of oxygen (for example, $CO_2$), or a mixture gas which includes these gases.

In the above embodiments, the target material is not limited to a gas or to clusters. The target material may also be in form of a liquid, liquid droplets, or fine particles.

The angle of incidence of the soft X-rays onto the parabolic mirror varies over the surface of the mirror. Therefore, it order to effect a more uniform reflection off the parabolic mirror, the thickness of the multi-layer reflective film may vary over the surface of the parabolic mirror, such that the effective thickness of the multi-layer reflective film seen by the soft X-rays is the same over the entire surface.

In the above embodiments, a parabolic mirror is used to generate parallel beams, however, an ellipsoidal mirror may also be used to form converging or diverging soft X-ray beams. Further, it is also apparent that other mirrors having rotational symmetry around their optical axis may be used in the present invention.

It will be apparent to those skilled in the art that various modifications and variations can be made in the method and apparatus for soft x-ray generation of the present invention without departing from the spirit or scope of the invention. Thus, it is intended that the present invention covers the modifications and variations of this invention provided they come within the scope of the appended claims and their equivalents.

What is claimed is:

1. A soft X-ray source comprising:
    a mirror having a focal point, the mirror being parabolic or ellipsoidal;
    a nozzle delivering a target material to a plasma generation point substantially coincident with the focal point; and
    a laser source delivering a pulsed laser beam to the plasma generation point,
    wherein a plasma is generated at the plasma generation point upon irradiation by the pulsed laser beam, the plasma emitting soft X-rays that are formed into X-ray beams by the mirror,
    wherein the X-ray beams are parallel if reflected from the parabolic mirror and converging if reflected from the ellipsoidal mirror, and
    wherein one of an axis of the nozzle and an axis of the pulsed laser beam is coaxial with an axis of the mirror.

2. The soft X-ray source of claim 1, further including a reflective surface on a concave face of the mirror that reflects the soft X-rays emitted from the plasma.

3. The soft X-ray source of claim 2, wherein the reflective surface does not reflect the soft X-rays towards the nozzle.

4. The soft X-ray source of claim 1, wherein the target material is a liquid.

5. The soft X-ray source of claim 1, wherein the target material is a solid.

6. The soft X-ray source of claim 5, further including:
    a protective plate that protects the mirror from the target material; and
    a target material recovery device that collects the target material when the protective plate is protecting the mirror.

7. The soft X-ray source of claim 1, wherein the target material is one of a gas and clusters.

8. The soft X-ray source of claim 1, further including a hole in the mirror, wherein the pulsed laser beam is delivered through the hole to the plasma generation point.

9. A method of generating soft X-rays comprising the steps of:
    ejecting a target material from a nozzle towards a plasma generation point;
    irradiating the target material with a pulsed laser beam; and forming soft X-ray beams by reflecting soft X-rays emitted by the plasma from a mirror, the mirror being parabolic or ellipsoidal, the soft X-ray beams being parallel or converging, wherein the pulsed laser beam is directed towards substantially a focal point of the mirror, the focal point being substantially coincident with the plasma generation point, and wherein one of an axis of the nozzle and an axis of the pulsed laser beam is coaxial with an axis of the mirror.

10. The method of claim 9, wherein the mirror includes a reflective surface that reflects the soft X-rays emitted by the plasma and forms the soft X-ray beams.

11. An apparatus for generating soft X-rays comprising:
a nozzle ejecting a target material towards a plasma generation point;
a mirror having a focal point that substantially corresponds to the plasma generation point, the mirror being parabolic or ellipsoidal; and
a laser source delivering at least two pulsed laser beams to the plasma generation point,
wherein a plasma is generated at the plasma generation point in response to irradiation by the two pulsed laser beams, and
wherein the plasma emits the soft X-rays, the soft X-rays being reflected into parallel or converging X-ray beams by the mirror, and
wherein one of an axis of the nozzle and an axis of the pulsed laser beam is coaxial with an axis of the mirror.

12. The apparatus of claim 11, wherein the pulsed laser source delivers at least four pulsed laser beams to the plasma generation point.

13. The apparatus of claim 11, wherein the nozzle is positioned away from the plasma generation point, such that the pulsed laser beams do not impact the nozzle.

14. The apparatus of claim 11, further including at least two apertures in the mirror, wherein the at least two pulsed laser beams are delivered through the at least two apertures to the plasma generation point.

15. The apparatus of claim 14, wherein a number of the apertures corresponds to a number of the pulsed laser beams.

16. The apparatus of claim 11, further including a soft X-ray filter in a path of the X-ray beams, the soft X-ray filter including a first portion that passes the soft X-rays, and a second portion that blocks the soft X-rays.

17. The apparatus of claim 11, further including a soft X-ray reflection mirror that reflects the soft X-rays towards the mirror, the soft X-ray reflection mirror having a focal point substantially coincident with the plasma generation point.

18. The apparatus of claim 11, wherein the mirror includes a multi-layer reflective film having a thickness distribution so that the mirror has the same reflection wavelength throughout its surface for soft X-rays emitted from the focal point of the mirror.

19. A method of generating soft X-rays comprising the steps of:
ejecting a target material towards a plasma generation point from a nozzle;
irradiating the target material at the plasma generation point with at least two pulsed laser beams so as to form a plasma; and
reflecting soft X-rays emitted by the plasma from a mirror to form beams, the mirror being parabolic or ellipsoidal,
wherein the beams are parallel if reflected from the parabolic mirror and converging if reflected from the ellipsoidal mirror,
wherein a focal point of the mirror is substantially coincident with the plasma generation point, and
wherein one of an axis of the nozzle and an axis of the pulsed laser beam is coaxial with an axis of the mirror.

20. The method of claim 19, wherein the nozzle is positioned away from the plasma generation point such that the two pulsed laser beams do not impact the nozzle.

21. The method of claim 19, further including the step of passing a first portion of the soft X-rays through a soft X-ray filter, and blocking a second portion of the beams with the soft X-ray filter.

22. The method of claim 19, further including the step of reflecting the soft X-rays emitted by the plasma from a soft X-ray reflective mirror towards the mirror,
wherein the soft X-ray reflective mirror has a focal point corresponding to the plasma generation point.

23. An electromagnetic wave source comprising:
a low pressure vessel;
a nozzle in the low pressure vessel, the nozzle ejecting a target material towards a plasma generation point;
a mirror having a focus corresponding to the plasma generation point, the mirror being parabolic or ellipsoidal; and
a laser irradiating the target material at the plasma generation point to convert a portion of the target material into a plasma,
wherein electromagnetic energy emitted by the plasma is reflected from the mirror to form beams,
wherein the beams are parallel if reflected from the parabolic mirror and converging if reflected from the ellipsoidal mirror.

24. An exposure apparatus comprising:
a source of electromagnetic waves in a wavelength range between 0.1 nm to 300 nm;
a source of target material, the target material being one of a liquid, liquid droplets, fine particles, gas and clusters;
an irradiation source for irradiating the target material and converting the target material into a plasma that emits radiation in the wavelength range between 0.1 nm to 300 nm,
wherein the source of electromagnetic waves includes an optical element for shaping the radiation into the electromagnetic waves,
wherein a reflective surface of the optical element is substantially axially symmetrical,
wherein the irradiation source irradiates the target material from a direction of the optical element,
wherein the source of the target material does not block a path of the electromagnetic waves, and
wherein the electromagnetic waves are parallel if reflected from the parabolic mirror and converging if reflected from the ellipsoidal mirror.

25. The exposure apparatus of claim 24, wherein the optical element includes a mirror, the mirror being parabolic or ellipsoidal,
wherein a central axis of the source of the target material and a central axis of the mirror coincide, and
wherein an optical axis of the irradiation source does not pass through the source of the target material.

26. The exposure apparatus of claim 24, wherein the target material jets out of the source of the target material in a direction along an axis of rotational symmetry of the optical element, and wherein the target material is irradiated from a plurality of directions.

27. The exposure apparatus of claim 26, wherein the plurality of directions are distributed at substantially equal angular intervals.

28. The exposure apparatus of claim 26, wherein beams from the irradiation source directed at the target material from the plurality of directions have substantially the same intensity, and irradiate the target material at substantially the same time.

29. The exposure apparatus of claim 26, wherein beams from the irradiation source directed at the target material irradiate the target material from one of the same direction and different directions at the same time.

30. The exposure apparatus of claim 24, wherein the optical element includes a multi-layer reflective film whose film having a thickness distribution so that the optical element has the same reflection wavelength throughout the reflective surface for electromagnetic waves emitted from a focal point of the optical element.

31. The exposure apparatus of claim 24, further including a filter to block a portion of the electromagnetic waves in the wavelength range between 0.1 nm to 300 nm emitted from a focal point of the optical element.

32. The exposure apparatus of claim 24, further including a reflective mirror reflecting the electromagnetic waves in the wavelength range between 0.1 nm to 300 nm generated at a focal point of the optical element, the reflective mirror having a focal point substantially coinciding with the focal point of the optical element and reflecting the electromagnetic waves in the wavelength range between 0.1 nm to 300 nm towards the optical element.

33. The exposure apparatus of claim 24, wherein the target material is one of xenon, krypton, oxygen, a compound of oxygen and a mixture gas including any one of xenon, krypton, oxygen, and the compound of oxygen.

* * * * *